United States Patent
Yonezawa et al.

(10) Patent No.: US 6,219,630 B1
(45) Date of Patent: *Apr. 17, 2001

(54) APPARATUS AND METHOD FOR EXTRACTING CIRCUIT, SYSTEM AND METHOD FOR GENERATING INFORMATION FOR SIMULATION, AND NETLIST

(75) Inventors: Hirokazu Yonezawa, Hyogo; Takuya Umeda, Kyoto; Satoshi Ishikura, Osaka, all of (JP)

(73) Assignee: Matsushita Electronics Corporation, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/758,868

(22) Filed: Dec. 2, 1996

(30) Foreign Application Priority Data

Dec. 7, 1995 (JP) .................................................. 7-318770

(51) Int. Cl.⁷ ....................................................... G06F 17/50
(52) U.S. Cl. .................................. 703/14; 703/20; 716/5
(58) Field of Search .................................. 364/489, 490, 364/578; 395/500; 703/14, 20, 4; 716/4, 11, 5

(56) References Cited

U.S. PATENT DOCUMENTS

| | | | |
|---|---|---|---|
| 5,258,919 | * 11/1993 | Yamanouchi et al. | 364/489 |
| 5,313,398 | * 5/1994 | Rohrer et al. | 364/468 |
| 5,381,345 | * 1/1995 | Takegami et al. | 364/491 |
| 5,471,409 | * 11/1995 | Tani | 364/578 |
| 5,490,095 | * 2/1996 | Shimada et al. | 364/578 |
| 5,553,008 | * 9/1996 | Huang et al. | 364/578 |
| 5,694,052 | * 12/1997 | Sawai et al. | 364/578 |
| 5,699,264 | * 12/1997 | Nakamura et al. | 364/489 |
| 5,787,008 | * 7/1998 | Pullela | 364/489 |

FOREIGN PATENT DOCUMENTS

| | | | |
|---|---|---|---|
| 1-293530 | 11/1989 | (JP) | G06F/15/60 |
| 5-198593 | 8/1993 | (JP) | G06F/15/60 |

OTHER PUBLICATIONS

Makris et al., "Analog IC Design Automation Part II—Automated Circuit Correction by Qualitative Reasoning", IEEE, 1995, p. 239–254.*

* cited by examiner

*Primary Examiner*—Kevin J. Teska
*Assistant Examiner*—Thai Phan
(74) *Attorney, Agent, or Firm*—McDermott, Will & Emery

(57) ABSTRACT

A circuit extracting apparatus or method of the present invention extracts circuit information which allows a drain current and a gate capacitance in an actual device to be reproduced with high fidelity in circuit simulation. Transistor-portion-configuration recognizing means recognizes the configuration of a transistor portion in the mask layout of a semiconductor circuit so as to generate transistor-portion-configuration data. Transistor-size calculating means calculates an equivalent transistor size based on the transistor-portion-configuration data, such that a drain current in the circuit simulation coincides with the drain current in the actual device. Corrective-capacitance generating means obtains the difference between a gate capacitance in the circuit simulation using the equivalent transistor size and the gate capacitance in the actual device so as to virtually generate a corrective capacitance having a capacitance value corresponding to the obtained difference. The equivalent transistor size and the corrective capacitance serve as the circuit information in the circuit simulation.

24 Claims, 11 Drawing Sheets

```
M20  10  22  13  5    NMODEL    W=4.8U  L=0.5U
M21   3  15   4  5    NMODEL    W=3.2U  L=0.5U
M22  32  12   7  5    NMODEL    W=5.2U  L=0.5U

C100  10  22   1.0E-17
C101  13  22   1.0E-17
C102   5  22   1.2E-17
C103   3  15   1.1E-17
C104   4  15   1.6E-17
```

Fig. 14
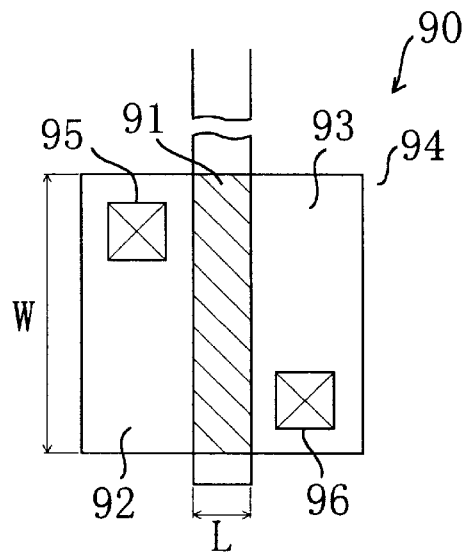
Fig. 15
M1  S  G  D  B    NMODEL  W=5U  L=0.5U
Fig. 16
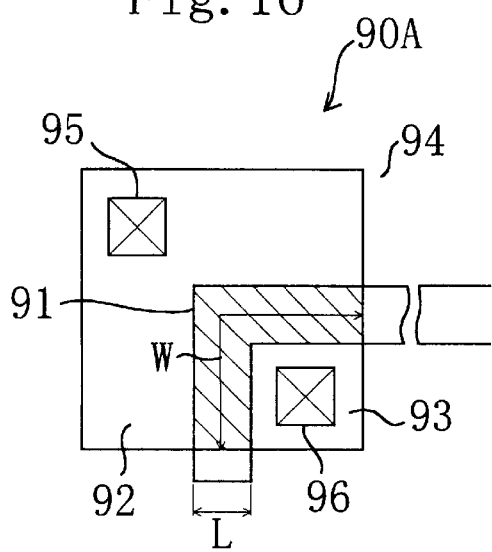

APPARATUS AND METHOD FOR EXTRACTING CIRCUIT, SYSTEM AND METHOD FOR GENERATING INFORMATION FOR SIMULATION, AND NETLIST

BACKGROUND OF THE INVENTION

The present invention relates to a circuit extracting apparatus and a circuit extracting method for extracting circuit information from a mask layout, which are for use in the design of a semiconductor integrated circuit.

With recent advances in processing and designing technology, LSIs (Large-Scale Integrated Circuits) represented by a microprocessor have been increasing rapidly in performance and integration. To implement the LSIs with higher performance and higher integration, it is required to perform circuit design with higher accuracy so that CAD (Computer Aided Design) tools have been playing an important role in high-accuracy circuit design.

The CAD tools closely related to the design accuracy includes a circuit simulator for simulating a designed LSI as an actual device (LSI manufactured in practice) based on a netlist containing information on such elements as a MOS transistor, a capacitor, a resistor, and an inductor and their interconnections as well as characteristic information including the transistor size (transistor width, transistor length), a capacitance value, a resistance value, and an inductance value. The netlist can be extracted from, e.g., the mask layout of the designed LSI by means of a circuit extracting apparatus.

By way of example, a description will be given to conventional LSI simulation using a circuit extracting apparatus and a circuit simulator and performed with respect to the MOS transistor shown in FIG. 14.

FIG. 14 shows an example of the mask layout of the MOS transistor. As shown in the drawing, the MOS transistor 90 comprises four terminals which are: a gate 91; a source 92; a drain 93; and a substrate 94. Contacts 95 and 96 provide connections to the source 92 and the drain 93. The MOS transistor 90 has a transistor width (gate width) W and a transistor length (gate length) L.

Initially, the circuit extracting apparatus extracts a netlist as shown in FIG. 15 from the mask layout shown in FIG. 14. The netlist shown in FIG. 15 describes the MOS transistor 90 and contains data on the transistor size (transistor width W, transistor length L).

Next, the circuit simulator performs circuit simulation based on the netlist shown in FIG. 15. The circuit simulator determines the drain current and gate capacitance of the MOS transistor 90 shown in FIG. 14 based on the transistor-size data contained in the netlist shown in FIG. 15 and reproduces the operation of the actual device.

However, the conventional LSI simulation has the following problems.

The conventional circuit extracting apparatus cannot extract a netlist from the mask layout such that the drain current and gate capacitance of the MOS transistor are reproduced with high fidelity in the circuit simulation performed by the circuit simulator.

In real physical devices, the drain currents and gate capacitances of MOS transistors are not necessarily equal if the configurations of the transistor portions (gates) thereof are different even though they have an equal transistor size (transistor width, transistor length). In a typical circuit simulator, however, MOS transistors having an equal transistor size (transistor width, transistor length) are considered to have an equal drain current and an equal gate capacitance.

FIG. 16 shows another example of the mask layout of the MOS transistor, depicting a MOS transistor 90A with the transistor portion (gate) 91 in a bent configuration. It is assumed here that the MOS transistor 90 shown in FIG. 14 and the MOS transistor 90A shown in FIG. 16 have an equal transistor width W and an equal transistor length L. In this case, however, the circuit simulator considers the MOS transistor 90 and the MOS transistor 90A to have an equal drain current and an equal gate capacitance, though the MOS transistors 90 and 90A in actual devices have different drain currents and different gate capacitances due to different configurations of the transistor portions 91.

If the transistor size of the MOS transistor is corrected in the netlist to increase the accuracy of the drain current in circuit simulation, the accuracy of the gate capacitance is reduced. Conversely, if the transistor size is corrected to increase the accuracy of the gate capacitance, the accuracy of the drain current is reduced.

Accordingly, a netlist which allows the drain current and gate capacitance in an actual device to be reproduced with high fidelity in circuit simulation has not conventionally been generated, with the result that circuit simulation has not conventionally been performed with high fidelity.

SUMMARY OF THE INVENTION

To overcome the foregoing problems, the present invention provides a circuit extracting apparatus and a circuit extracting method for extracting circuit information for use in circuit simulation from the mask layout of a semiconductor circuit, thereby achieving high-fidelity reproduction of the drain current and gate capacitance of a transistor in the circuit simulation.

Specifically, the present invention is for obtaining an equivalent transistor size for a transistor contained in the semiconductor circuit based on a configuration of the transistor recognized in the mask layout, such that a drain current of the transistor in the circuit simulation coincides with a drain current of the transistor in an actual device, and virtually generating a corrective capacitance having a capacitance value corresponding to the difference between a gate capacitance of the transistor in the circuit simulation using the equivalent transistor size and a gate capacitance of the transistor in the actual device.

According to the present invention, the difference between the drain current in the circuit simulation and the drain current in the actual device (semiconductor device manufactured in practice) resulting from different configurations of transistor portions can be eliminated by obtaining the equivalent transistor size. On the other hand, the difference between the gate capacitance in the circuit simulation and the gate capacitance in the actual device resulting from high-fidelity reproduction of the drain current by using the equivalent transistor size in addition to the different configurations of the transistor portions can be eliminated by virtually generating the corrective capacitance. Thus, by using the data on the equivalent transistor size and corrective capacitance as the circuit information for use in the circuit simulation, the drain current and gate capacitance of a transistor can be reproduced with high fidelity in the circuit simulation.

The present invention also provides a netlist containing the circuit information extracted by the foregoing circuit extracting apparatus and circuit extracting method.

Alternatively, the circuit extracting apparatus and method according to the present invention is for obtaining an equivalent transistor size for a transistor contained in the semiconductor circuit based on a configuration of the transistor recognized in the mask layout, such that a gate capacitance of the transistor in the circuit simulation coincides with a gate capacitance of the transistor in an actual device, and virtually generating a corrective current source having a current value corresponding to the difference between a drain current of the transistor in the circuit simulation using the equivalent transistor size and a drain current of the transistor in the actual device.

According to the present invention, the difference between the gate capacitance in the circuit simulation and the gate capacitance in the actual device which results from different configurations of the transistor portions can be eliminated by obtaining the equivalent transistor size. On the other hand, the difference between the drain current in the circuit simulation and the drain current in the actual device which results from high-fidelity reproduction of the gate capacitance by using the equivalent transistor size in addition to different configurations of the transistor portions can be eliminated by virtually generating the corrective current source. Accordingly, by using the data on the equivalent transistor size and corrective current source as the circuit information for use in the circuit simulation, the drain current and gate capacitance of the transistor can be reproduced with high fidelity in the circuit simulation.

The present invention also provides a netlist containing the circuit information extracted by the foregoing circuit extracting apparatus and circuit extracting method.

Furthermore, the present invention provides an information generating system for simulation, comprising: a circuit extracting apparatus for extracting circuit information for use in circuit simulation from a mask layout of a semiconductor circuit; and parameter extracting means for extracting a parameter for use in the circuit simulation from information including information on a manufacturing process of the semiconductor circuit, wherein the circuit extracting apparatus obtains an equivalent transistor size for a transistor contained in the semiconductor circuit based on a configuration of the transistor recognized in the mask layout, such that a gate capacitance of the transistor in the circuit simulation coincides with a gate capacitance of the transistor in an actual device, and outputs the obtained equivalent transistor size as the circuit information for use in the circuit simulation and the parameter extracting means receives the equivalent transistor size obtained by the circuit extracting apparatus and extracts the parameter such that a drain current of the transistor in the circuit simulation using the equivalent transistor size coincides with a drain current of the transistor in the actual device.

By the foregoing information generating system for simulation, the difference between the gate capacitance in the circuit simulation and the gate capacitance in the actual device resulting from different configurations of transistor portions can be eliminated by using, as the circuit information, the equivalent transistor size calculated by the circuit extracting apparatus. On the other hand, the difference between the drain current in the circuit simulation and the drain current in the actual device resulting from high-fidelity reproduction of the gate capacitance by using the equivalent transistor size in addition to the different configurations of the transistor portions can be eliminated by extracting a parameter with which the drain current in the circuit simulation using the equivalent transistor size coincides with the drain current in the actual device by using the parameter extracting means. Consequently, the drain current and gate capacitance of the transistor can be reproduced with high fidelity in the circuit simulation.

BRIEF DESCRIPTION OF THE DRAWINGS

FIG. 14 shows an example of the mask layout of a MOS transistor;

FIG. 15 is a netlist extracted from the mask layout of the MOS transistor shown in FIG. 14; and FIG. 16 shows another example of the mask layout of the MOS transistor with a transistor portion (gate) in a bent configuration.

DETAILED DESCRIPTION OF THE INVENTION

Figure 1:
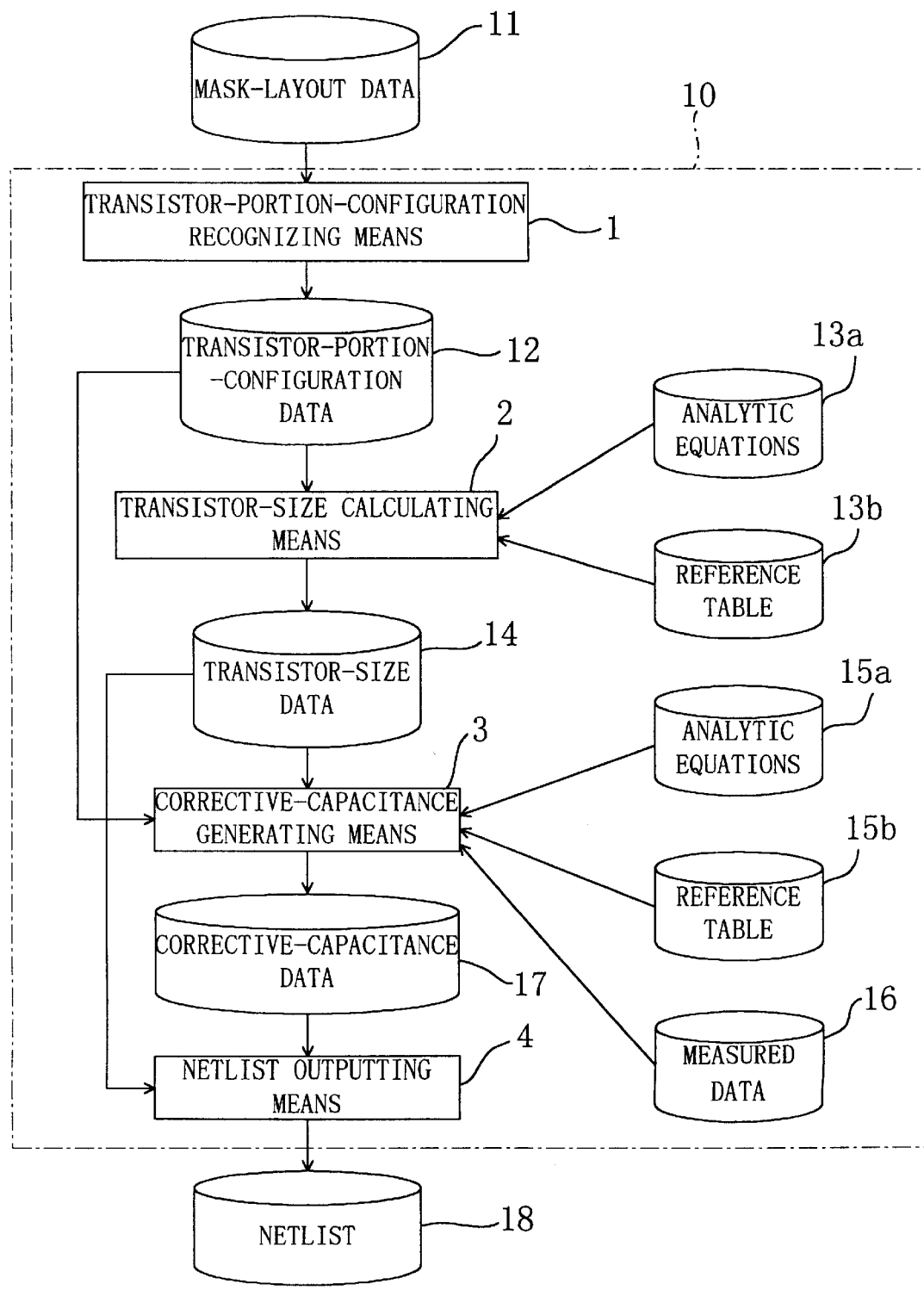
FIG. 1 is a block diagram showing the structure of a circuit extracting apparatus according to a first embodiment of the present invention.

Referring now to the drawings, the embodiments of the present invention will be described below.

(First Embodiment)

FIG. 1 is a block diagram showing the structure of a circuit extracting apparatus according to a first embodiment of the present invention. As shown in the drawing, the circuit extracting apparatus 10 according to the present embodiment comprises: transistor-portion-configuration recognizing means 1; transistor-size calculating means 2; corrective-capacitance generating means 3; and netlist outputting means 4.

The present embodiment calculates the transistor size (transistor width, transistor length) based on a drain current in an actual device to obtain a gate capacitance based on the result of calculation and incorporates the difference between the gate capacitance obtained from the calculated transistor size and a gate capacitance in the actual device as a corrective capacitance into a netlist, thereby improving the accuracy of circuit simulation.

A description will be given first to data flows between the individual components of the circuit extracting apparatus 10 shown in FIG. 1.

The transistor-portion-configuration recognizing means 1 reads mask-layout data 11 to recognize a MOS transistor and the configuration of the transistor portion thereof and outputs transistor-portion-configuration data 12. The transistor-size calculating means 2 reads the transistor-portion-configuration data 12 to obtain an equivalent transistor width and an equivalent transistor length, which will be described later, through calculation using analytic equations 13a or with reference to a reference table 13b and outputs the equivalent transistor width and the equivalent transistor length as transistor-size data 14. The corrective-capacitance generating means 3 reads the transistor-portion-configuration data 12 and the transistor-size data 14 to obtain the corrective capacitance, which will be described later, through calculation using analytic equations 15a or with reference to a reference table 15b and outputs the corrective capacitance as corrective-capacitance data 17. The netlist outputting means 4 reads the transistor-size data 14 and the corrective-capacitance data 17 and outputs a netlist 18.

Below, the operations of the individual components of the circuit extracting apparatus 10 shown in FIG. 1 will be described in greater detail.

The description will be given first to the operation of the transistor-portion-configuration recognizing means 1.

The transistor-portion-configuration recognizing means 1 reads the mask-layout data 11 and recognizes the MOS transistor having four terminals which are a gate, a source, a drain, and a substrate in the read mask-layout data 11. After recognizing the MOS transistor, the transistor-portion-configuration recognizing means 1 then recognizes the configuration of the transistor portion of the recognized MOS transistor.

FIGS. 2 are schematic views showing the mask layouts of MOS transistors with transistor portions in different configurations. In each of the drawings are shown: a diffused region 60; and a polysilicon region 61. A transistor portion 62 (hatched in FIGS. 2) is generally defined as a region in which the diffused region 60 and the polysilicon region 61 are overlapping. In the description of the present embodiment, the configurations of the transistor portions 62 are roughly classified into the types shown in FIGS. 2(a) to 2(e): FIG. 2(a) shows a transistor portion in a linear configuration; FIG. 2(b) shows a transistor portion in a 90-degree bent configuration; FIG. 2(c) shows a transistor portion in an irregular configuration; FIG. 2(d) shows a transistor portion in a 45-degree bent; and the FIG. 2(e) shows a transistor portion of varying transistor length.

The transistor-portion-configuration recognizing means 1 obtains the vertex coordinates of the transistor portion 62 to compare the X and Y coordinates thereof with each other, thereby recognizing the configuration of the transistor portion 62. Then, the transistor-portion-configuration recognizing means 1 assigns the recognized configuration of the transistor portion 62 to any one of the types shown in FIGS. 2(a) to 2(e).

The transistor-portion-configuration recognizing means 1 outputs the result of recognition as the transistor-portion-configuration data 12. Table 1 shows an example of the transistor-portion-configuration data 12.

TABLE 1

| TRANSISTOR IDENT- IFICATION NO. | TRANSISTOR PORTION- CONFIGURATION CLASSIFICATION CODE | TRANSISTOR-PORTION VERTEX COORDINATES (X,Y) |
| --- | --- | --- |
| M1 | a | (1,1), (1.5,1), (1.5,6), (1,6) |
| M2 | b | (1,1), (1.5,1), (1.5,3), (3,3), (3,3.5), (1,3.5) |
| M3 | c | (1,1), (1.5,1), (1.5,3), (2,3), (2,6), (1.5,6), (1.5,3.5), (1,3.5) |
| . | . | . |
| . | . | . |
| . | . | . |

In the example shown in Table 1, the transistor-portion-configuration data 12 consists of: a transistor identification number; a transistor-portion-configuration classification code; and transistor-portion vertex coordinates. The transistor identification number is given to any recognized MOS transistor in a one-to-one relationship. The transistor-portion-configuration classification code is for classifying the configurations of the transistor portions 62. In the example shown in Table 1, the classification code a represents the linear configuration shown in FIG. 2(a), the classification code b represents the 90-degree bent configuration shown in FIG. 2(b), and the classification code c represents the irregular configuration shown in FIG. 2(c). The transistor-portion vertex coordinates are coordinate information (X, Y) composed of two-dimensional X and Y coordinates representing each vertex of the transistor 62, which is used to obtain the transistor size. Since the number of vertices differs depending on the configuration of the transistor portion 62, the number of sets of coordinate information differs depending on the configuration of the transistor portion 62. For example, the classification code a (representing the linear configuration shown in FIG. 2(a)) has four sets of coordinate information and the classification code b (representing the 90-degree bent configuration) has six sets of coordinate information.

Next, the operation of the transistor-size calculating means 2 will be described.

As described above, the transistor-size calculating means 2 calculates the transistor size (transistor width, transistor length) based on the drain current in the actual device. The calculated transistor size is termed the equivalent transistor size (equivalent transistor width, equivalent transistor length).

The transistor-size calculating means 2 initially reads the transistor-portion-configuration data 12 and then calculates the equivalent transistor width W and the equivalent transistor length L for each of the MOS transistors included in the read transistor-portion-configuration data 12 to implement a drain current equivalent to the drain current in the actual device by using the analytic equations 13a or the reference table 13b.

To implement the drain current equivalent to the drain current in the actual device means to establish equal relations between the transistor size, the configuration of the transistor portion 62, and the drain current which differ from one manufacturing process to another. Specifically, although the circuit simulator determines the drain current based on the given transistor size and the capability of the manufacturing process, the difference in drain current resulting from different configurations of the transistor portions 62 cannot be reflected in the result of simulation, as described above. To apparently improve the accuracy of the circuit simulator, therefore, it is necessary to reflect in the transistor size the difference in drain current resulting from the different configurations of the transistor portions 62, thereby implementing the drain current equivalent to the drain current in the actual device.

As the value of the drain current in the actual device, there can be used a measured value or a value obtained by means of a process simulator, a device simulator, or the like which can reflect the different configurations of the transistor portions in the result of simulation.

In the case where the obtained drain current in the actual device can be expressed as a function, the analytic equations 13a are used. In the case where it is difficult to express the obtained drain current in the actual device as a function, the reference table 13b is used.

A description will be given first to the case where the analytic equations 13a are used. In the case of using the analytic equations 13a, an analytic equation corresponding to the transistor-portion-configuration classification code (shown in Table 1) of a MOS transistor of interest is selected from the analytic equations 13a, while the dimensions including the lengths of the edges of the transistor portion are calculated based on the transistor-vertex coordinates (shown in Table 1) of the MOS transistor. The calculated size is substituted in the analytic equation selected from the analytic equations 13a so that the equivalent transistor width W and the equivalent transistor length L of the MOS transistor are calculated.

The analytic equations 13a for calculating the equivalent transistor widths W and the equivalent transistor lengths L of the transistor portions configured as shown in FIGS. 2(a) to 2(e) are as follows:

$$(W, L)=(W1+W2+K_x \times W_x, L1)$$

FIG. 2(c)

$$(W, L)=(W1+W2+K_x \times W_x, L1)$$

FIG. 2(d)

$$(W, L)=(W1+W2+W3+K_x \times W_x+K_y \times W_y, L1)$$

FIG. 2(e)

$$(W, L)=(W1, L1), (W2, L2), (K_x \times W_x, K_y \times (L1+L2)/2) \quad (1)$$

(where W1, W2, W3, $W_x$, and $W_y$ are the respective transistor widths of the transistor portions 62 represented by using the lengths of the respective center lines thereof, which are shown in FIGS. 2(a) to 2(e); L1 and L2 are the respective transistor lengths of the transistor portions 62, which are shown in FIGS. 2(a) to 2(e); and $K_x$ and $K_y$ are corrective coefficients for reflecting in the transistor size the difference in drain current resulting from the different configurations of the transistor portions 62). Since the difference in drain current resulting from the different configurations of the transistor portions 62 varies depending on an LSI manufacturing process, the corrective, coefficients $K_x$ and $K_y$ also vary depending on an LSI manufacturing process.

Figure 2A:
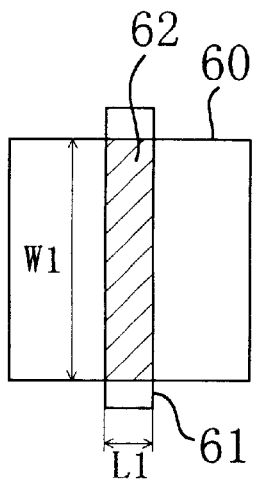
FIGS. 2(a) to 2(e) are schematic views showing the respective mask layouts of MOS transistors with transistor portions in different configurations.
Figure 2B:
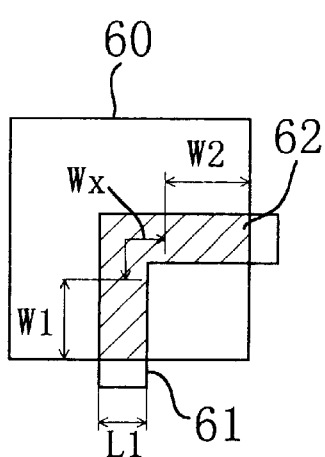
Figure 2C:
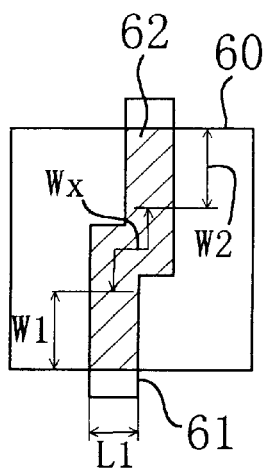
Figure 2D:
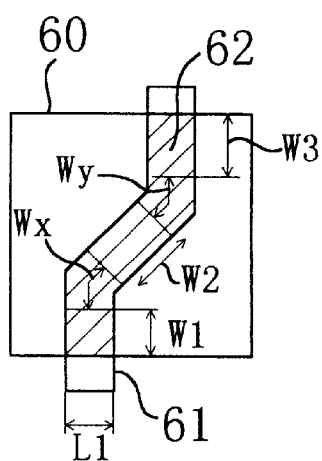
Figure 2E:
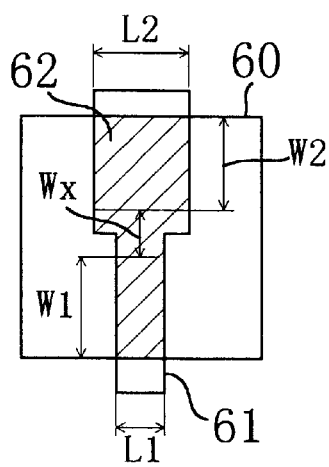
Figure 3:
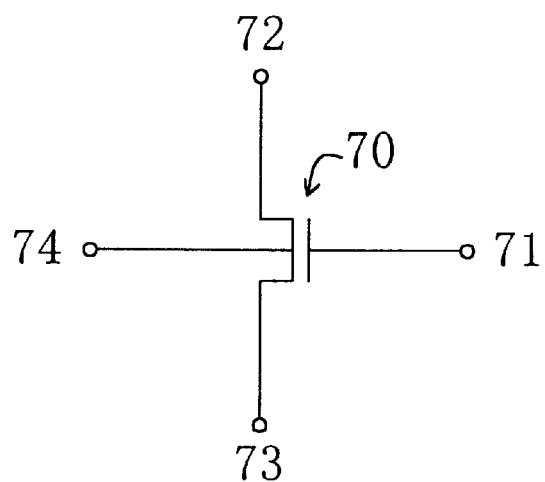
FIG. 3 is a circuit diagram corresponding to each of the MOS transistors shown in FIGS. 2(a) to 2(d)
Figure 4:
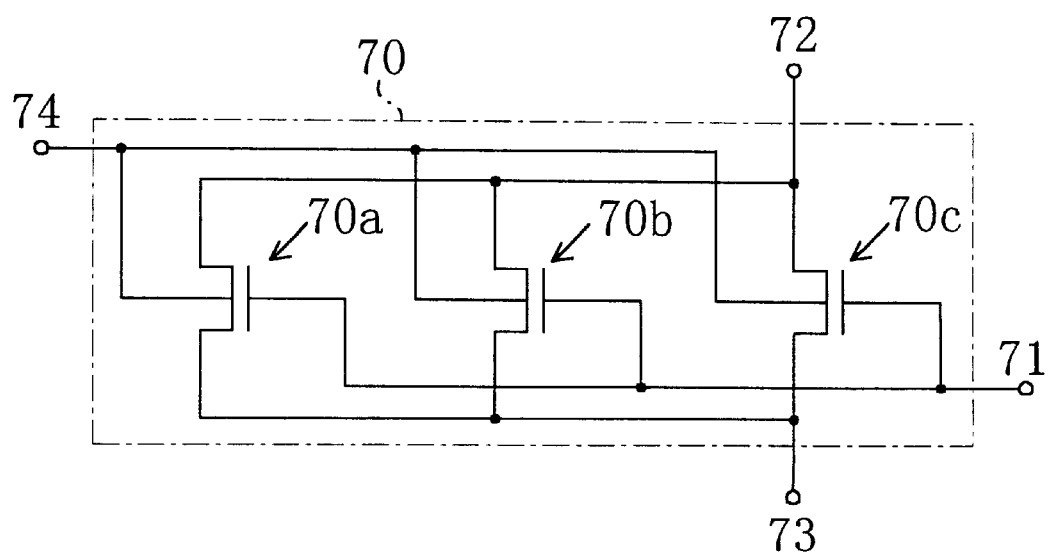
FIG. 4 is a circuit diagram corresponding to the MOS transistor shown in FIG. 2(e)

Each of the MOS transistor having the transistor portions in the configurations shown in FIGS. 2(a) to 2(d) is represented by a circuit 70 composed of one transistor as shown in FIG. 3. As for a MOS transistor having a transistor portion of varying transistor length as shown in FIG. 2(e), it is represented by the circuit 70 consisting of a plurality of transistors 70a, 70b, and 70c obtained by dividing the transistor portion 62 into segments in accordance with different transistor lengths and connected in parallel as shown in FIG. 4. The segmental transistors obtained through division can be treated similarly to the transistor which is not divided in circuit simulation. Therefore, it is necessary to calculate the three equivalent transistor widths W and the equivalent transistor lengths L for the transistor portion in the configuration shown in FIG. 2(e). In FIGS. 3 and 4, reference numerals 71, 72, 73, and 74 designate gates, sources, drains, and substrates, respectively.

As the analytic equations 13a, there may be used arbitrary functions using the respective dimensions of the transistor portions 62 as variables. For instance, the equivalent transistor widths W of the transistor portions configured as shown in FIGS. 2(a) to 2(e) are given by the following equations. The equivalent transistor lengths L are also calculated in the same manner:

FIG. 2(a)

$$W=\text{function a } (W1, L1)$$

FIG. 2(b)

$$W=\text{function b } (W1, W2, W_x, L1)$$

FIG. 2(c)

$$W=\text{function c } (W1, W2, W_x, L1)$$

FIG. 2(d)

$$W=\text{function d } (W1, W2, W3, W_x, W_y, L1)$$

FIG. 2(e)

$$W=\text{function e } (W1, W2, W_x, L1, L2) \quad (2)$$

(where function a to function e are functions representing the equivalent transistor widths W in the respective transistor configurations).

The description will be given next to the case of using the reference table 13b. The reference table 13b has, e.g., a table describing the equivalent transistor width W and equivalent transistor length L corresponding to the size of the transistor portion 62 for each of the transistor-portion-configuration classification codes. The transistor-size calculating means 2 searches the reference table 13b by using such information as the transistor-portion-configuration classification codes and transistor-vertex coordinates included in the transistor-portion-configuration data 12 and reads the specified equivalent transistor width W and equivalent transistor length L.

Table 2 shows an example of the table included in the reference table 13b, which describes the equivalent transistor widths W for the combination of the transistor widths W1 and W2.

TABLE 2

| W1 (μm) | W2 (μm) | W (μm) |
|---|---|---|
| 1.0 | 1.0 | 2.5 |
| 1.0 | 2.0 | 3.6 |
| 1.0 | 3.0 | 4.7 |
| 2.0 | 1.0 | 3.6 |

TABLE 2-continued

| W1 (μm) | W2 (μm) | W (μm) |
|---------|---------|--------|
| 2.0 | 2.0 | 4.7 |
| 2.0 | 3.0 | 5.7 |
| . | . | . |
| . | . | . |
| . | . | . |

In the case of using the reference table 13b, when a proper size value is not found on the table included therein, the equivalent transistor width W and the equivalent transistor lengths L are calculated approximately by interpolation or extrapolation.

In the case of using the reference table 13b, therefore, the equivalent transistor size (equivalent transistor width, equivalent transistor length) can be calculated more accurately as a larger number of sets of data reflecting the configuration and transistor size of the transistor portion 62 are provided.

The data on the equivalent transistor size (equivalent transistor width, equivalent transistor length) thus obtained is outputted as the transistor-size data 14. Table 3 shows an example of the transistor-size data 14, which presents the equivalent transistor widths W and equivalent transistor lengths L in accordance with the transistor classification numbers.

TABLE 3

| TRANSISTOR IDENTIFICATION NO. | W (μm) | L (μm) |
|---|---|---|
| M10 | 5.4 | 0.5 |
| M11 | 3.2 | 1.2 |
| M12 | 3.2 | 0.8 |
| M13 | 6.6 | 1.5 |
| . | . | . |
| . | . | . |
| . | . | . |

Next, the operation of the corrective-capacitance generating means 3 will be described. The corrective-capacitance generating means 3 calculates the difference between a gate capacitance in the circuit simulation and a gate capacitance in the actual device, which results from the different configurations of the transistor portions 62 and the updating of the transistor size by the transistor-size calculating means 2, to virtually generate the corrective capacitance having a value corresponding to the calculated difference. Specifically, the value of the corrective capacitance is calculated by subtracting, from the measured gate capacitance or the like, the gate capacitance calculated based on the equivalent transistor size calculated by the transistor-size calculating means 2.

The corrective-capacitance generating means 3 initially reads the transistor-portion-configuration data 12 obtained by the transistor-portion-configuration recognizing means 1 and the transistor-size data 14 calculated by the transistor-size calculating means 2.

Next, the gate capacitance of each MOS transistor is calculated based on the equivalent transistor width and equivalent transistor length included in the transistor-size data 14. The gate capacitance is subdivided into a gate-to-source capacitance, a gate-to-drain capacitance, and a gate-to-substrate capacitance, each of which can be calculated based on the analytic equations 15a or the reference table 15b. Then, the difference between the calculated gate capacitance and the gate capacitance in the actual device included in the measured data 16 is calculated to be used as the value of the corrective capacitance.

In the following description, the gate-to-source capacitance, gate-to-drain capacitance, and gate-to-substrate capacitance in the actual device will be designated by Cgs1, Cgd1, and Cgb1, respectively, while the gate-to-source capacitance, gate-to-drain capacitance, and gate-to-substrate capacitance calculated based on the equivalent transistor widths W and equivalent transistor lengths L will be designated by Cgs2, Cgd2, and Cgb2, respectively.

The gate capacitances Cgs1, Cgd1, Cgb1 in the actual device included in the measured data 16 have been calculated by actual measurement, process simulation, or device simulation which allows the measurement of not only the difference in gate capacitance resulting from different transistor sizes and different capabilities of manufacturing processes but also the difference in gate capacitance resulting from the different configurations of the transistor portions 62.

Table 4 shows an example of the measured data 16. The measured data 16 is prepared for each configuration of the transistor portion 62 and Table 4 shows the gate capacitance of the transistor portion 62 in the actual device, which is in the linear configuration shown in FIG. 2(a).

TABLE 4

| W1 (μm) | L1 (μm) | Cgs1 (fF) | Cgd1 (fF) | Cgb1 (fF) |
|---|---|---|---|---|
| 1.0 | 1.0 | 1.01 | 1.01 | 1.01 |
| 1.0 | 2.0 | 2.01 | 2.01 | 2.02 |
| 1.0 | 3.0 | 3.02 | 3.02 | 3.03 |
| 2.0 | 1.0 | 2.01 | 2.01 | 2.02 |
| . | . | . | . | . |
| . | . | . | . | . |

On the other hand, the gate capacitance based on the equivalent transistor widths W and equivalent transistor lengths L are calculated as follows.

A description will be given first to the case where the analytic equations 15a are used. The analytic equations 15a have arbitrary functions representing the gate-to-source capacitance Cgs2, the gate-to-drain capacitance Cgd2, and the gate-to-substrate capacitance Cgb2 and using the equivalent transistor widths W and the equivalent transistor lengths L as variables. The analytic equations 15a represent the individual gate capacitances as follows:

$$Cgs2 = \text{function gs}(W, L)$$

$$Cgd2 = \text{function gd}(W, L)$$

$$Cgb2 = \text{function gb}(W, L) \quad (3)$$

(where function gs, function gd, and function gb are functions representing the gate capacitances). As the functions representing the gate capacitances, functions used as models of the gate capacitances of a MOS transistor embedded in the circuit simulator or the like are used.

The corrective-capacitance generating means 3 calculates the specified gate capacitances by substituting the equivalent transistor widths W and equivalent transistor lengths L included in the transistor-size data 14 in the analytic equations 15a.

A description will be given next to the case where the reference table 15b is used. The reference table 15b describes the gate-to-source capacitances Cgs2, gate-to-drain capacitances Cgd2, and gate-to-substrate capacitances Cgb2 for the combinations of the equivalent transistor widths W and the equivalent transistor lengths L. Table 5 shows an example of the reference table 15b.

TABLE 5

| W ($\mu$m) | L ($\mu$m) | Cgs2 (fF) | Cgd2 (fF) | Cgb2 (fF) |
|---|---|---|---|---|
| 1.0 | 1.0 | 1.01 | 1.01 | 1.01 |
| 1.0 | 2.0 | 2.01 | 2.01 | 2.02 |
| 1.0 | 3.0 | 3.02 | 3.02 | 3.03 |
| 2.0 | 1.0 | 2.01 | 2.01 | 2.02 |
| . | . | . | . | . |
| . | . | . | . | . |
| . | . | . | . | . |

The corrective capacitance generating means 3 searches the reference table 15b by using the equivalent transistor width W and equivalent transistor length L included in the transistor-size data 14 and reads the specified gate capacitances. In the case where the proper combination of the equivalent transistor width W and equivalent transistor length L is not found in the reference table 15b, the gate capacitances are approximately calculated by interpolation or extrapolation.

Next, the corrective capacitances are calculated from the gate capacitances in the actual device and the gate capacitances calculated based on the equivalent transistor size. If a gate-to-source corrective capacitance, a gate-to-drain corrective capacitance, and a gate-to-substrate corrective capacitance are designated by $\Delta$Cgs, $\Delta$Cgd, and $\Delta$Cgb, the individual corrective capacitances are given by the following equations:

$\Delta Cgs = Cgs1 - Cgs2$ $\Delta Cgd = Cgd1 - Cgd2$ $\Delta Cgb = Cgb1 - Cgb2$ (4)

(Specific Example of Calculation)

The calculation of the corrective capacitances will be described by using specific numeric values. It is assumed here that the MOS transistor recognized in the mask-layout data 11 by the transistor-portion-configuration recognizing means 1 has a transistor portion in the linear configuration shown in FIG. 2(a) and that the transistor width W1 and transistor length L1 thereof are both 1.0 ($\mu$m).

First, the transistor-size calculating means 2 calculates the equivalent transistor width W and equivalent transistor length L of the MOS transistor, which are given by the following equations according to the equations (1)

(W, L)=(W1, L1)

=(1.0, 1.0)

Next, the corrective-capacitance generating means 3 calculates the values of the corrective capacitances. If the gate capacitances in the actual device can be calculated based on the measured data 16 shown in Table 4, Cgs1=1.01

Cgd1=1.01

Cgb1=1.01 are satisfied. On the other hand, the gate capacitances based on the equivalent transistor size are given by the following equations according to, e.g., the analytic equations 15a:

Cgs2=function gs (W, L)=function gs (1.0, 1.0)=1.0

Cgd2=function gd (W, L)=function gd (1.0, 1.0)=1.0

Cgb2=function gb (W, L)=function gb (1.0, 1.0)=1.0

Hence, the corrective capacitances are given by the following equations according to the equations (4):

$\Delta Cgs = Cgs1 - Cgs2 = 1.01 - 1.0 = 0.01$ $\Delta Cgd = Cgd1 - Cgd2 = 1.01 - 1.0 = 0.01$ $\Delta Cgb = Cgb1 - Cgb2 = 1.01 - 1.0 = 0.01$.

The respective values of the corrective capacitances thus calculated are outputted as the corrective-capacitance data 17. Table 6 shows an example of the corrective-capacitance data 17, which describes the three corrective capacitances $\Delta$Cgs, $\Delta$Cgd, and $\Delta$Cgb for each of the transistor identification numbers.

TABLE 6

| TRANSISTOR IDENTIFICATION NO. | $\Delta$Cgs (fF) | $\Delta$Cgd (fF) | $\Delta$Cgb (fF) |
|---|---|---|---|
| M1 | 0.01 | 0.01 | 0.02 |
| M2 | 0.02 | 0.02 | 0.02 |
| M3 | 0.03 | 0.03 | 0.02 |
| M4 | 0.01 | 0.02 | 0.03 |
| . | . | . | . |
| . | . | . | . |
| . | . | . | . |

Since the gate capacitance has the property that its value varies depending on an applied voltage, a netlist which can further improve the accuracy of the circuit simulation can be generated by modifying the analytic equations 15a or the reference table 15b such that it reflects the property.

Next, the operation of the netlist outputting means 4 will be described in greater detail.

The netlist outputting means 4 reads the transistor-size data 14 and the corrective-capacitance data 17, reads the equivalent transistor size (equivalent transistor width W, equivalent transistor length L) of each MOS transistor out of the transistor-size data 14, and writes the MOS transistor having the equivalent transistor size in the netlist 18. The netlist outputting means 4 also reads the corrective capacitances of each MOS transistor, i.e., the gate-to-source corrective capacitance $\Delta$cgs, gate-to-drain corrective capacitance $\Delta$Cgd, and gate-to-substrate corrective capacitance $\Delta$cgb out of the corrective-capacitance data 17 and writes the read corrective capacitances in the netlist 18.

Figures 5, 6:
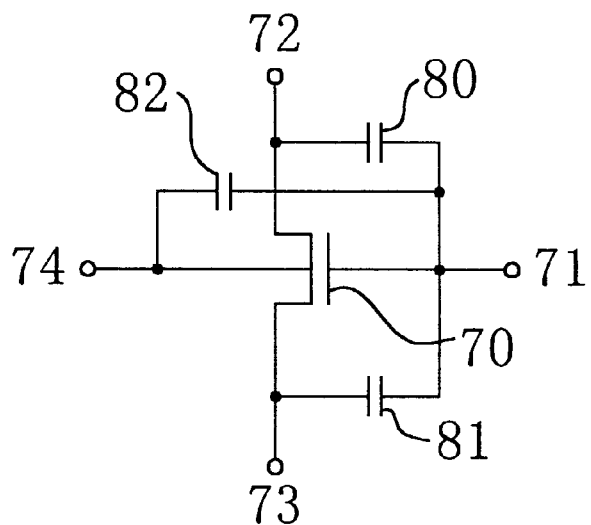
FIG. 5 is a circuit diagram showing the interconnection of a MOS transistor described in a netlist according to the first embodiment of the present invention.
FIG. 6 shows an example of the netlist according to the first embodiment of the present invention.

FIG. 5 is a circuit diagram showing the interconnection of the MOS transistor written in the netlist 18 according to the present embodiment. In the drawing are shown: a gate-to-source corrective capacitance 80; a gate-to-drain corrective capacitance 81; and a gate-to-substrate corrective capacitance 82.

FIG. 6 shows an example of the netlist 18 generated by the netlist outputting means 4. In the drawing, the rows beginning with the capital "M" represent MOS transistors, in which: the first terms represent the transistor identification numbers; the second to fifth terms represent the terminal numbers of the MOS transistors; the sixth terms represent the types of the MOS transistors; the seventh terms represent the equivalent transistor widths; and the eighth terms represent the equivalent transistor lengths. The rows beginning with the capital "C" represent the capacitances (corrective capacitance), in which: the first terms represent capacitance identification numbers; the second and third terms represent two terminals connected to capacitances; and the fourth terms represent the values of the capacitances.

In the circuit extracting apparatus according to the present embodiment thus described, the drain current is equated with an actual value by calculating the equivalent transistor size (equivalent transistor width, equivalent transistor length), while the gate capacitance is also equated with actual values by virtually calculating the corrective capacitances. Accordingly, it becomes possible to output a netlist which allows both of the physical quantities of the drain current and gate capacitance to be reproduced with high fidelity in the circuit simulation.

Although the transistor-size calculating means 2 and the corrective-capacitance generating means 3 have selectively used the analytic equations and the reference table in the present embodiment, it is also possible to use either the analytic equations or reference table singly.

Although only the MOS transistors and corrective capacitances are described in the netlist in the present embodiment, information on the configurations (such as area and circumference) of the source and drain of the transistor, a parasitic capacitance such as a wiring capacitance, a parasitic resistance such as a wiring resistance, a contact resistance, a source resistance, or a drain resistance, or a parasitic inductance may also be extracted from the mask layout and described in the netlist.

Although the present embodiment generates the netlist by using the netlist outputting means 4, it is also possible to simply use the transistor-size data 14 and the corrective-capacitance data 17 as the output data from the circuit extracting apparatus according to the present embodiment.

Figure 7:
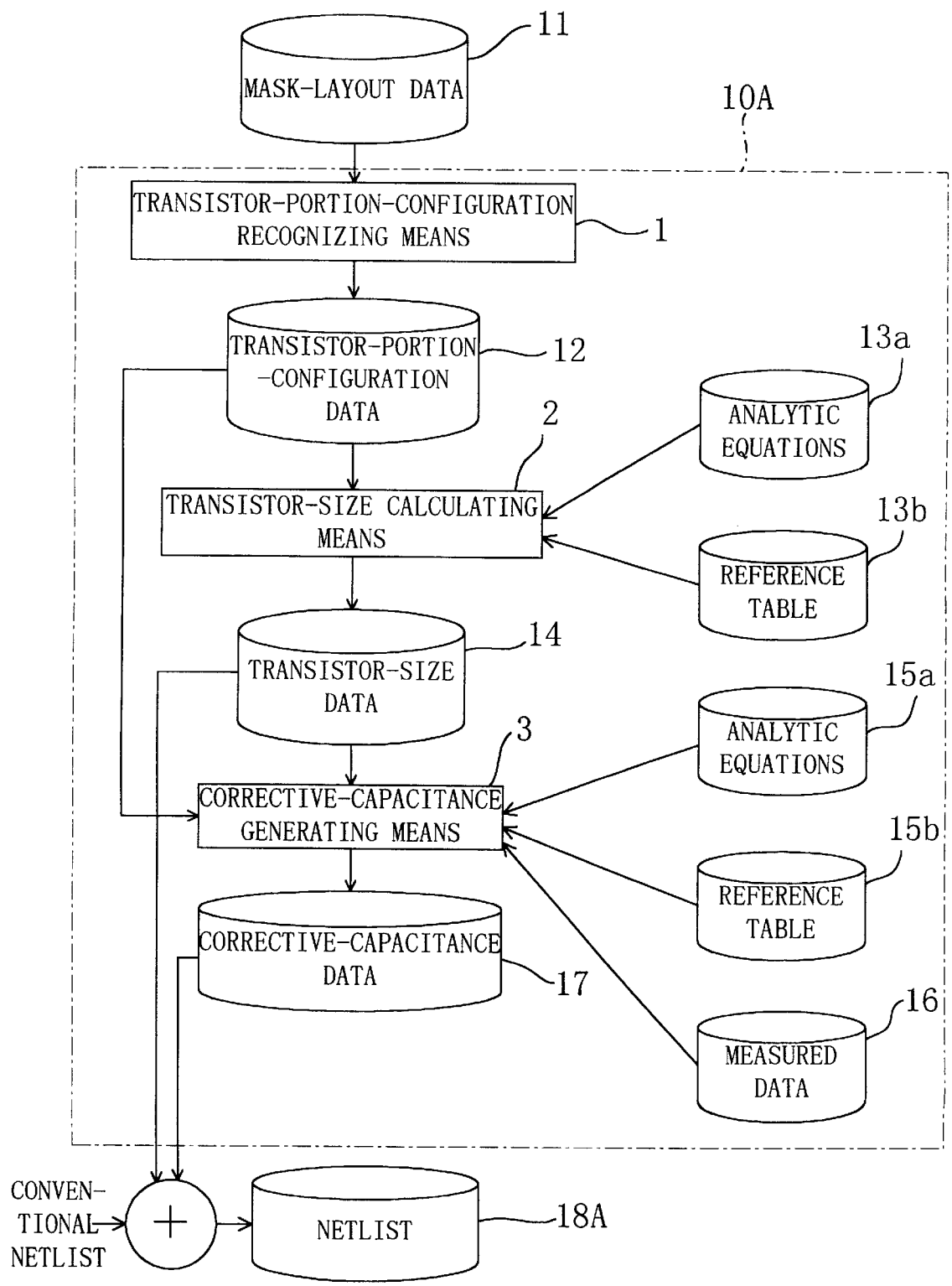
FIG. 7 is a block diagram showing the structure of a variation of the circuit extracting apparatus according to the first embodiment of the present invention.

FIG. 7 is a block diagram showing the structure of a variation of the circuit extracting apparatus according to the present embodiment. In the drawing, the circuit extracting apparatus 10A does not comprise the netlist outputting means 4 comprised by the circuit extracting apparatus 10 shown in FIG. 1 so that the transistor-size data 14 calculated by the transistor-size calculating means 2 and the corrective-capacitance data 17 generated by the corrective-capacitance generating means 3 are outputted directly to the outside. In the case of using the circuit extracting apparatus 10A shown in FIG. 7, a netlist 18A similar to the netlist 18 outputted from the circuit extracting apparatus 10 shown in FIG. 1 can be generated by entirely replacing the transistor-size data in a conventional netlist with the transistor-size data 14 and adding the corrective-capacitance data 17 thereto. Although the transistor identification numbers of the transistor-size data 14 and corrective-capacitance data 17 outputted from the circuit extracting apparatus 10A may differ from those of the conventional netlist, there should be no problem if software for comparing the netlists is used for proper adjustment.

(Second Embodiment)

Figure 8:
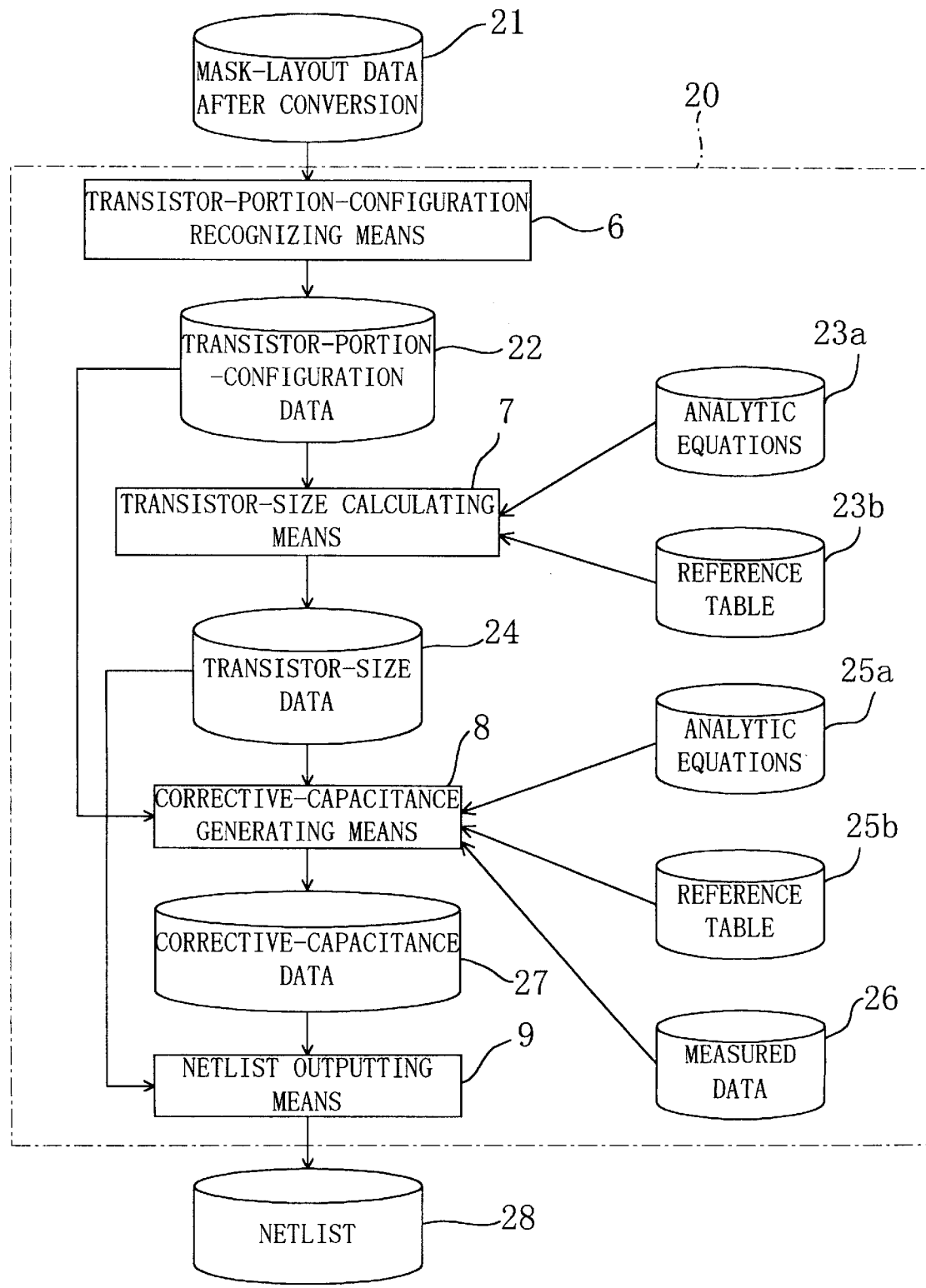
FIG. 8 is a block diagram showing the structure of a circuit extracting apparatus according to a second embodiment of the present invention.
Figure 9A:
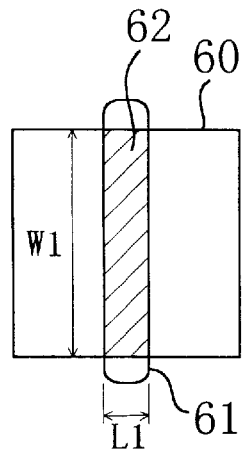
FIGS. 9(a) to 9(e) are schematic views showing the final configurations of the MOS transistors manufactured in accordance with the mask layouts shown in FIGS. 2(a) to 2(e)
Figure 9B:
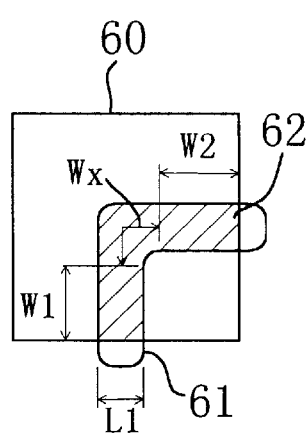
Figure 9C:
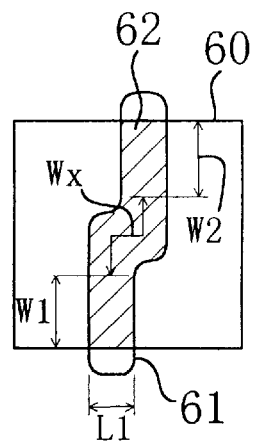
Figure 9D:
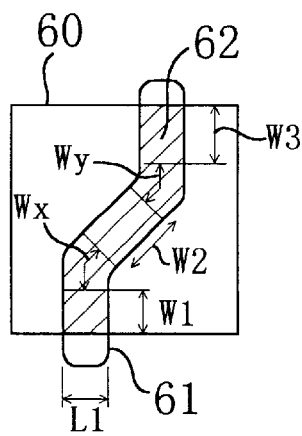
Figure 9E:
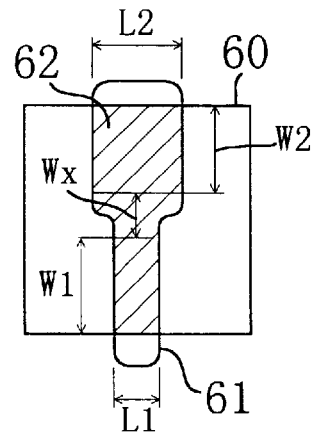

FIG. 8 is a block diagram showing the structure of a circuit extracting apparatus according to a second embodiment of the present invention. As shown in the drawing, the circuit extracting apparatus 20 according to the present embodiment comprises: a transistor-portion-configuration recognizing means 6 which can recognize the configuration of a transistor portion in a mask layout reflecting the final configuration thereof; a transistor-size calculating means 7; a corrective-capacitance generating means 8; and a netlist outputting means 9. The second embodiment is different from the first embodiment in that a netlist can be extracted from the mask layout reflecting the final configuration of the transistor portion. The netlist outputting means 9 is identical with the netlist outputting means 4 of the circuit extracting apparatus 10 according to the first embodiment shown in FIG. 1.

FIGS. 9(a) to 9(e) are schematic views showing the configurations of MOS transistors fabricated in accordance with the mask layouts shown in FIGS. 2(a) to 2(e).

In general, the mask layout is composed of a combination of straight lines. However, when actual devices are fabricated based on mask layouts as shown in FIGS. 2, the finished actual devices have partially curved configurations as shown in FIGS. 9. The differences between the mask layouts and the final configurations slightly influence the operations of the actual devices. As device miniaturization proceeds, the difference between the mask layouts and the final configurations is increased in the manufacturing process to finally reach the point where the influence exerted by the final configurations on the operations of the actual devices cannot be neglected.

In view of the influence exerted by the difference between the mask layouts and the finished configurations on the operations of the actual devices, the present embodiment preliminarily converts the mask layouts in consideration of the finished configurations of the actual devices and calculates an equivalent transistor size and a corrective capacitance for a mask layout obtained through the conversion, thereby performing circuit simulation with higher fidelity than in the first embodiment.

A description will be given first to data flows between the individual components of the circuit extracting apparatus 20 shown in FIG. 8.

The transistor-portion-configuration recognizing means 6 reads mask-layout data after conversion 21, recognizes a MOS transistor and the configuration of the transistor portion thereof, and outputs transistor-portion-configuration data 22. The transistor-size calculating means 7 reads the transistor-portion-configuration data 22, calculates an equivalent transistor width and an equivalent transistor length from analytic equations 23$a$ or with reference to a reference table 23$b$, and outputs them as transistor-size data 24. The corrective-capacitance generating means 8 reads the transistor-portion-configuration data 22 and the transistor-size data 24, calculates corrective capacitances from analytic equations 25$a$ or with reference to a reference table 25$b$, and outputs corrective-capacitance data 27. The netlist outputting means 9 reads the transistor-size data 24 and the corrective-capacitance data 27 and outputs a netlist 28.

The mask-layout data after conversion 21 is generated from the original mask layout by means of a process simulator capable of simulating the finished configuration after the manufacturing process in detail.

Next, the operation of the transistor-portion-configuration recognizing means 6 will be described in detail. The transistor-portion-configuration recognizing means 6 is different from the transistor-portion-configuration recognizing means 1 of the circuit extracting apparatus 10 according to the first embodiment shown in FIG. 1 in that the transistor-portion-configuration recognizing means 6 can recognize the configuration of a transistor portion with a contour curve.

The transistor-portion-configuration recognizing means 6 reads the mask-layout data after conversion 21 and recognizes a MOS transistor having four terminals which are a gate, a source, a drain, and a substrate. In the mask-layout data after conversion 21, the mask layout of the MOS transistor is as shown in any one of FIGS. 9(a) to 9(e). A transistor portion 62 (hatched in FIGS. 9) is defined as a region in which a diffused region 60 and a polysilicon region 61 are overlapping, similarly to the first embodiment.

After recognizing the MOS transistor, the transistor-portion-configuration recognizing means 6 then recognizes the configuration of the recognized transistor portion 62 and assigns it to, e.g., any one of the types shown in FIGS. 9(*a*) to 9(*e*). FIG. 9(*a*) shows the transistor portion 62 in a linear configuration. FIG. 9(*b*) shows the transistor portion 62 in a 90-degree bent configuration. FIG. 9(*c*) shows the transistor portion 62 in an irregular configuration. FIG. 9(*d*) shows the transistor portion 62 in a 45-degree bent configuration. FIG. 9(*e*) shows the transistor portion 62 of varying transistor length.

The transistor-portion-configuration recognizing means 6 outputs the result of recognition as the transistor-portion-configuration data 22. The transistor-portion-configuration data 22 consists of the transistor identification number and transistor-portion-configuration classification code shown in Table 1 and a numerical expression representing a curved portion considered in converting the original mask layout to generate the mask-layout data after conversion 21 and the beginning and ending coordinates of the curved portion. The beginning coordinates and ending coordinates of the curved portion are coordinate information (X, Y) composed of two-dimensional X and Y coordinates used subsequently to calculate the transistor size.

Next, the operation of the transistor-size calculating means 7 will be described in greater detail. The transistor-size calculating means 7 is different from the transistor-size calculating means 2 of the circuit extracting apparatus 10 according to the first embodiment shown in FIG. 1 in that the equivalent transistor size can be calculated thereby with high accuracy even from the transistor-portion-configuration data 22 including the numerical expression for the curved portion and the beginning and ending coordinates thereof.

The transistor-size calculating means 7 initially reads the transistor-portion-configuration data 22 and then calculates an equivalent transistor width W and an equivalent transistor length L for each of the MOS transistors contained in the transistor-portion-configuration data 22 which has been read by using the analytic equations 23*a* or the reference table 23*b*.

The analytic equations 23*a* are different from the analytic equations 13*a* in the circuit extracting apparatus 10 according to the first embodiment shown in FIG. 1 in that, even when transistor portions judged to have the same configuration actually have different contour curves, the analytic equations are provided for the respective contour curves each represented by an contour-curve numerical expression, beginning coordinates, and ending coordinates. Hence, equivalent transistor sizes which allow high-fidelity reproduction of drain currents can be calculated for respective transistors judged to have the same configuration but actually having different contour curves each represented by a contour-curve numerical expression, beginning coordinates, and ending coordinates.

When transistor portions judged to have the same configuration actually have different contour curves, the reference table 23*b* also has tables for the respective contour curves each represented by a contour-curve numerical expression, beginning coordinates, and ending coordinates.

Next, the operation of the corrective-capacitance generating means 8 will be described. The corrective-capacitance generating means 8 is different from the corrective-capacitance generating means 3 of the circuit extracting apparatus 10 according to the first embodiment shown in FIG. 1 in that corrective capacitances can be calculated thereby with high accuracy even from the transistor-portion-configuration data 22 including a numerical expression for a contour curve and the beginning and ending coordinates of the curve.

Specifically, the calculating operation is performed by using the analytic equations 25*a* and the reference table 25*b* reflecting different contour curves each represented by a contour-curve numerical expression, beginning coordinates, and ending coordinates, similarly to the transistor-size calculating means 7.

As described above, the circuit extracting apparatus according to the present embodiment can calculate the equivalent transistor size and corrective capacitance even from the mask layout obtained through conversion in consideration of the final configurations of an actual device. Consequently, there can be extracted a netlist which allows higher-fidelity reproduction of the drain current and gate capacitance in circuit simulation than in the first embodiment.

Although the present embodiment has performed mask-layout conversion only to the polysilicon region 61 to implement a curved contour as shown in FIG. 9, the mask-layout conversion may also be performed to the diffused region, an interconnecting region, or the like.

Although the transistor-size calculating means 7 and the corrective-capacitance generating means 8 have selectively used the analytic equations and the reference table in the present embodiment, it is also possible to use either the analytic equations or the reference table singly.

Although the present embodiment is structured to output only the MOS transistor and the corrective capacitance to the netlist, it may also be structured to extract information on the configurations (such as area and circumference) of the source and drain of the transistor, a parasitic capacitance such as a wiring capacitance, a parasitic resistance such as a wiring resistance, a contact resistance, a source resistance, or a drain resistance, or a parasitic inductance from the mask layout and outputs it to the netlist.

Although the present embodiment is structured to generate the netlist by using the netlist outputting means 9, it is also possible to use the transistor-size data 24 and the corrective-capacitance data 27 as the output data from the circuit extracting apparatus according to the present embodiment, similarly to the variation of the first embodiment shown in FIG. 7.

(Third Embodiment)

Figure 10:
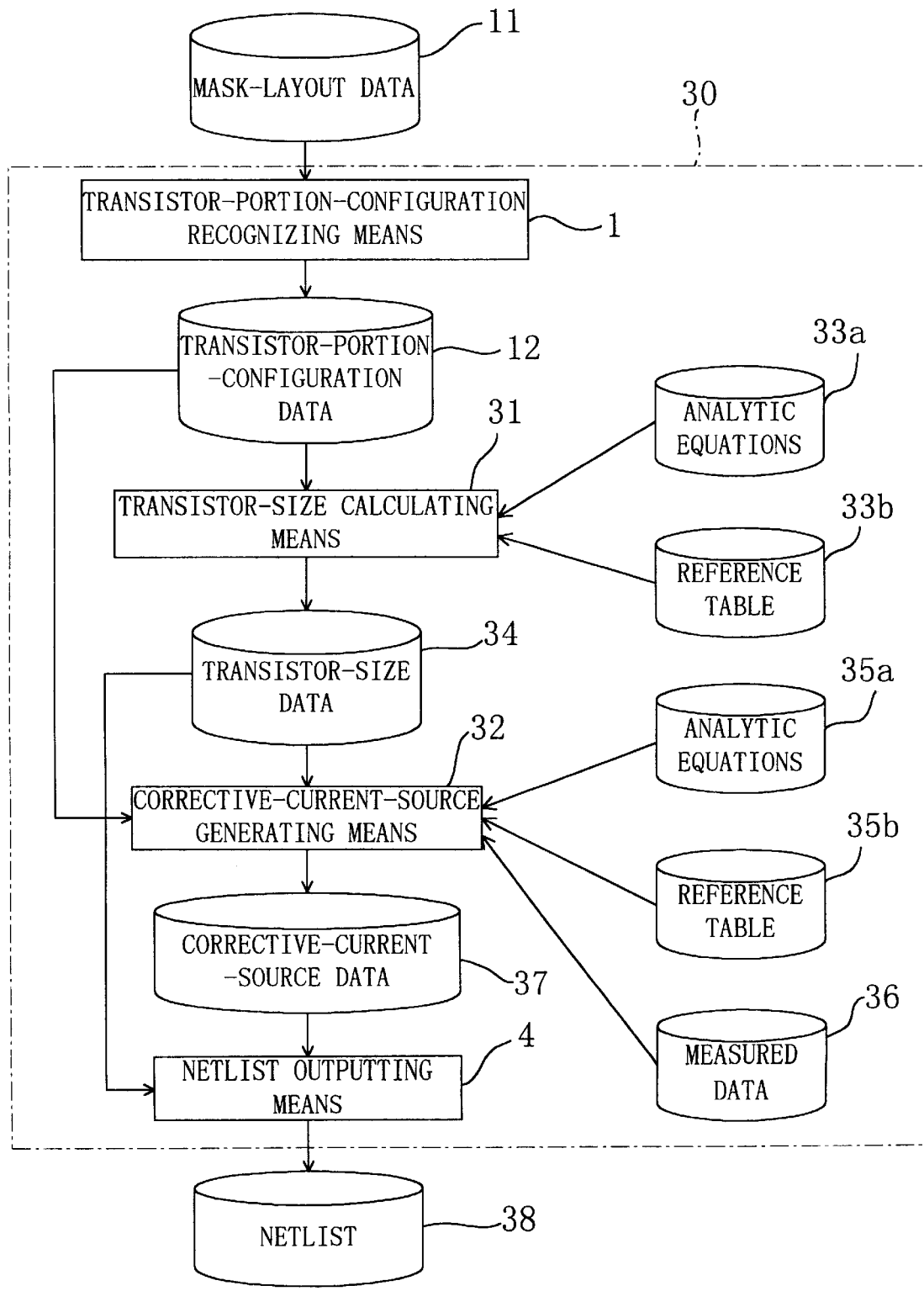
FIG. 10 is a block diagram showing the structure of a circuit extracting apparatus according to a third embodiment of the present invention.

FIG. 10 is a block diagram showing the structure of a circuit extracting apparatus according to a third embodiment of the present invention. The circuit extracting apparatus 30 according to the present embodiment shown in FIG. 10 comprises: a transistor-portion-configuration recognizing means 1 which is the same as used in the circuit extracting apparatus 10 according to the first embodiment shown in FIG. 1; a netlist outputting means 4 which is the same as used in the circuit extracting apparatus 10 according to the first embodiment shown in FIG. 1; a transistor-size calculating means 31; and a corrective-current-source generating means 32.

In the first and second embodiments, the equivalent transistor size (equivalent transistor width, equivalent transistor length) is calculated such that the drain current in the circuit simulation coincides with the drain current in the actual device, while the difference between the gate capacitance in the circuit simulation using the calculated equivalent transistor size and the gate capacitance in the actual device is used as the corrective capacitance.

In the present embodiment, by contrast, the equivalent transistor size (equivalent transistor width, equivalent transistor length) is calculated such that a gate capacitance in circuit simulation coincides with a gate capacitance in an actual device, while the difference between a drain current in the circuit simulation using the calculated equivalent transistor size and a drain current in the actual device is represented by a corrective current source.

A description will be given to data flows between the individual components of the circuit extracting apparatus 30 according to the present embodiment shown in FIG. 10.

The transistor-portion-configuration recognizing means 1 initially reads mask-layout data 11, recognizes a MOS transistor and the configuration of the transistor portion thereof, and outputs transistor-portion-configuration data 12. The transistor-size calculating means 31 reads the transistor-portion-configuration data 12, calculates an equivalent transistor width and an equivalent transistor length by using analytic equations 33a or with reference to a reference table 33b such that the gate capacitance in the circuit simulation coincides with the gate capacitance in the actual device, and outputs the equivalent transistor width and equivalent transistor length as transistor-size data 34. The corrective-current-source generating means 32 reads the transistor-portion-configuration data 12 and the transistor-size data 34, virtually calculates the corrective current source, which will be described later, from analytic equations 35a or with reference to a reference table 35b, and outputs the corrective current source as corrective-current-source data 37. The netlist outputting means 4 reads the transistor-size data 34 and the corrective-current-source data 37 and outputs a netlist 38.

Next, the operations of the individual components of the circuit extracting apparatus 30 shown in FIG. 10 will be described. Since the transistor-portion-configuration recognizing means 1 and the netlist outputting means 4 are the same as used in the first embodiment, the description thereof is omitted here.

The transistor-size calculating means 31 initially reads the transistor-portion-configuration data 12 and calculates an equivalent transistor width W and an equivalent transistor length L for each of the MOS transistors contained in the transistor-portion-configuration data 12 which has been read, such that the gate capacitance of the MOS transistor becomes equivalent to the gate capacitance in the actual device.

As the value of the gate capacitance in the actual device, a measured value or a value obtained by a process simulator, a device simulator, or the like which can reflect the different configurations of the transistor portions in the result of simulation can be used. In the case where the obtained gate capacitance in the actual device can be expressed as a function, the analytic equations 33a are used. In the case where it is difficult to express the obtained gate capacitance in the actual device as a function, the reference table 33b is used. Since the analytic equations 33a and the reference table 33b are used in the same manner as in the first embodiment, the description thereof is omitted here.

The corrective-current-source generating means 32 calculates the difference between a drain current of each of the MOS transistors on a mask layout for which the equivalent transistor size (equivalent transistor width, equivalent transistor length) has been calculated and the drain current in the actual device resulting from different configurations of the transistor portions and the updating of the transistor size by the transistor-size calculating means 31 and virtually generates a corrective-current source having an amount of current corresponding to the calculated difference.

Specifically, the amount of current from the corrective current source is calculated by subtracting, from the measured drain current or the like, the drain current calculated based on the equivalent transistor size (equivalent transistor width, equivalent transistor length) calculated by the transistor-size calculating means 31.

The corrective-current generating means 32 initially reads the transistor-portion-configuration data 12 obtained by the transistor-portion-configuration recognizing means 1 and the transistor-size data 34 calculated by the transistor-size calculating means 31.

Next, the corrective-current-source generating means 32 calculates the drain current of each of the MOS transistors based on the equivalent transistor width and equivalent transistor length included in the transistor-size data 34. The drain current is calculated by using the analytic equations 35a and the reference table 35b. Then, the corrective-current-source generating means 32 calculates the difference between the calculated drain current and the actual drain current included in the measured data 36 and virtually generates a current source having an amount of current corresponding to the difference as the corrective current source.

Table 7 shows an example of the measured data 36. The measured data 36 is prepared for each configuration of the transistor portion and Table 7 shows an actual drain current IDS flowing through the transistor portion in the linear configuration shown in FIG. 2(a).

TABLE 7

| W1 ($\mu$m) | L1 ($\mu$m) | I$_{DS}$ ($\mu$A) |
| --- | --- | --- |
| 1.0 | 1.0 | 100 |
| 1.0 | 2.0 | 50 |
| 1.0 | 3.0 | 30 |
| 2.0 | 1.0 | 200 |
| . | . | . |
| . | . | . |
| . | . | . |

Figure 11:
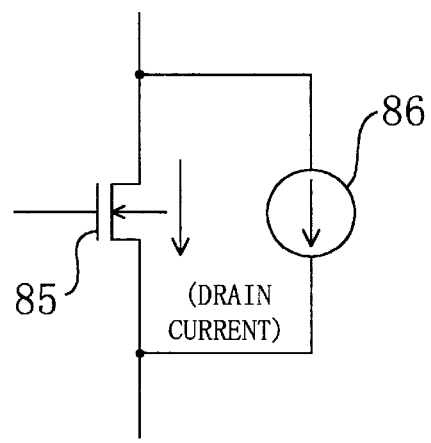
FIG. 11 is a circuit diagram showing the interconnection of a MOS transistor described in a netlist according to the third embodiment of the present invention.

FIG. 11 shows the interconnection of the MOS transistor written in the netlist 38. In the drawing are shown: the MOS transistor 85; and a corrective current source 86 generated virtually. As shown in FIG. 11, the corrective current source 86 is provided in parallel with the MOS transistor 85. The direction of a current from the corrective current source 86 is the same as the direction of the drain current of the MOS transistor 85 when the drain current in the actual device is larger than the drain current calculated based on the equivalent transistor size (when the current difference is positive), while it is opposite to the direction of the drain current of the MOS transistor 85 when the drain current in the actual device is smaller than the drain current calculated based on the equivalent transistor size (when the current difference is negative).

As described above, in the apparatus for extracting a semiconductor circuit according to the present embodiment, the gate capacitance can be adjusted to coincide with an actual value by calculating the equivalent transistor size (equivalent transistor width and equivalent transistor length), while the drain current can also be adjusted to coincide with an actual value by virtually calculating the corrective current source. Accordingly, there can be extracted from the mask-layout data a netlist which allows both of the physical quantities of the drain current and gate capacitance to be reproduced with high fidelity in the circuit simulation.

The following is the result of comparison made between the present embodiment and the first embodiment.

When the difference between the gate capacitance in the actual device and the gate capacitance calculated based on the equivalent transistor size is positive in the first embodiment, the difference in gate capacitance can be represented by the virtual corrective capacitance. When the difference in gate capacitance is negative, on the other hand, the difference in gate capacitance cannot be incorporated in the netlist, since the capacitance having a negative value does not exist. In the present embodiment, by contrast, the difference between the drain current in the actual device and the drain current calculated based on the equivalent transistor size can be incorporated in the netlist by using the virtual corrective current source even though the difference in drain current is positive or negative, since the positivity or negativity of the difference in drain current can be represented by the direction of the current from the corrective current source.

In the first embodiment, moreover, it is difficult to consider the dependence of the gate capacitance on a voltage since the gate capacitance is adjusted to coincide with the actual value by means of the corrective capacitance having a specified value. This is because the actual gate capacitance varies with the gate voltage, though the gate capacitance is obtained at the operating voltage (e.g., 5 or 3 V) of the circuit in the first embodiment. In the present embodiment, by contrast, it is possible to consider the dependence of the capacitance on the voltage.

Although the transistor-size calculating means 31 and the corrective-current-source generating means 32 have selectively used the analytic equations and the reference table in the present embodiment, it is also possible to use either the analytic equations or the reference table singly.

Although the present embodiment is structured to output only the MOS transistor and the corrective current source to the netlist, it may also be structured to extract information on the configurations (such as area and circumference) of the source and drain of the transistor, a parasitic capacitance such as a wiring capacitance, a parasitic resistance such as a wiring resistance, a contact resistance, a source resistance, or a drain resistance, or a parasitic inductance from the mask layout and outputs it to the netlist.

Although the present embodiment is structured to generate the netlist by using the netlist outputting means 4, it may also be structured to use the transistor-size data 34 and the corrective-current-source data 37 as the output data, similarly to the variation of the first embodiment shown in FIG. 7.

Similar to the second embodiment, it is possible to, in view of the influence exerted by the difference between the mask layouts and the finished configurations on the operations of the actual devices, perform circuit simulation with further higher fidelity in such a manner that the mask layouts are preliminarily converted in consideration of the finished configurations of the actual devices and an equivalent transistor size and a corrective current source are calculated for a mask layout obtained through the conversion.

(Fourth Embodiment)

Figure 12:
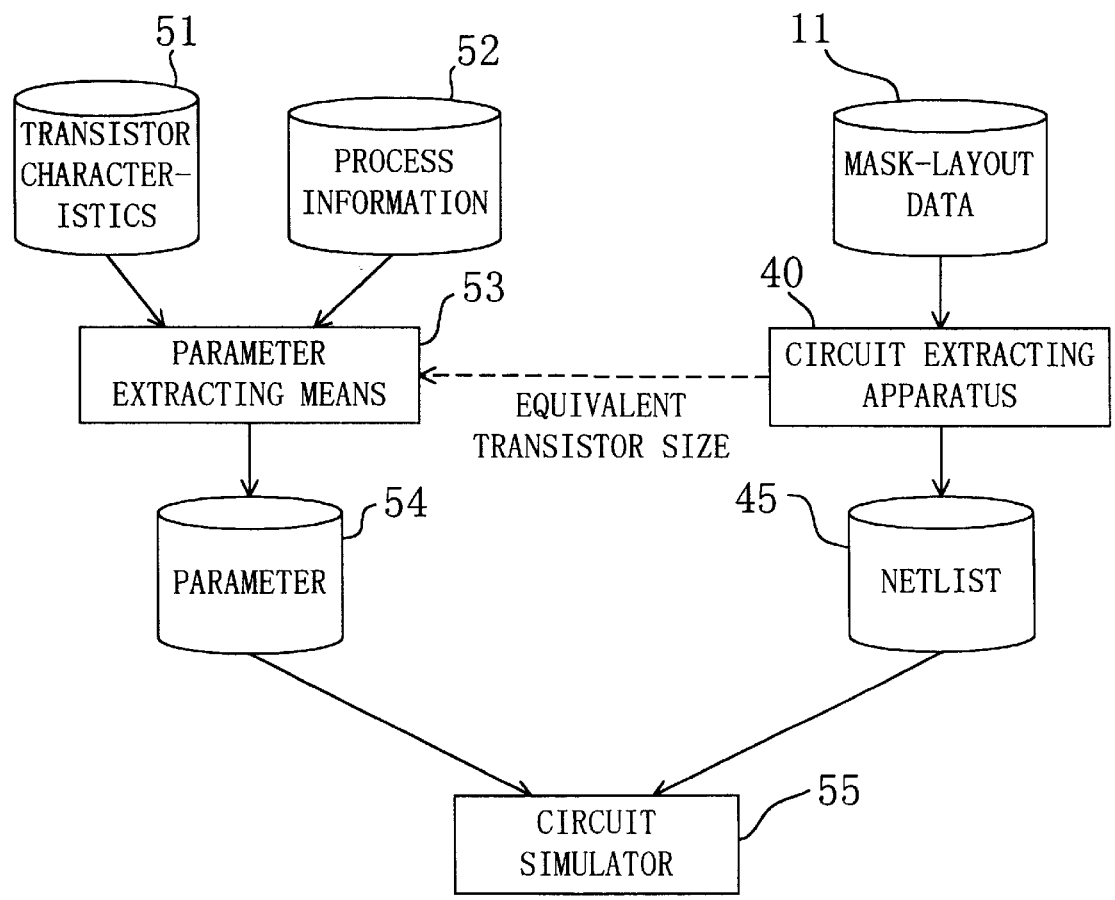
FIG. 12 is a schematic view of an information generating system for simulation.

FIG. 12 schematically shows an information generating system for simulation according to a fourth embodiment of the present invention. As shown in the drawing, the information generating system for simulation according to the present embodiment comprises: a circuit extracting apparatus 40; and parameter extracting means 53. In general, a circuit simulator 55 performs circuit simulation by using, as information, a netlist 45 extracted from mask-layout data 11 by the circuit extracting apparatus 40 and a parameter 54 extracted from transistor characteristics 51 and process information 52 by the parameter extracting means 53.

The first to third embodiments are for generating the netlist 45 which allows the circuit extracting apparatus 40 to reproduce both the drain current and the gate capacitance with high fidelity in the circuit simulation. As for the parameter 54, it is the same as used conventionally.

By contrast, the present embodiment calculates the equivalent transistor size (equivalent transistor width, equivalent transistor length) and incorporates the calculated equivalent transistor size into the netlist 45 so as to adjust the gate capacitance to coincide with an actual value, while correcting the parameter 54 for use in circuit simulation based on the equivalent transistor size (equivalent transistor width, equivalent transistor length) so as to adjust the drain current to coincide with an actual value. In other words, the present embodiment reflects information corresponding to the corrective current source virtually generated in the third embodiment in the parameter 54. In FIG. 12, the dashed line represents the flow of data on the equivalent transistor size (equivalent transistor width, equivalent transistor length) from the circuit extracting apparatus 40 to the parameter extracting means 53.

Figure 13:
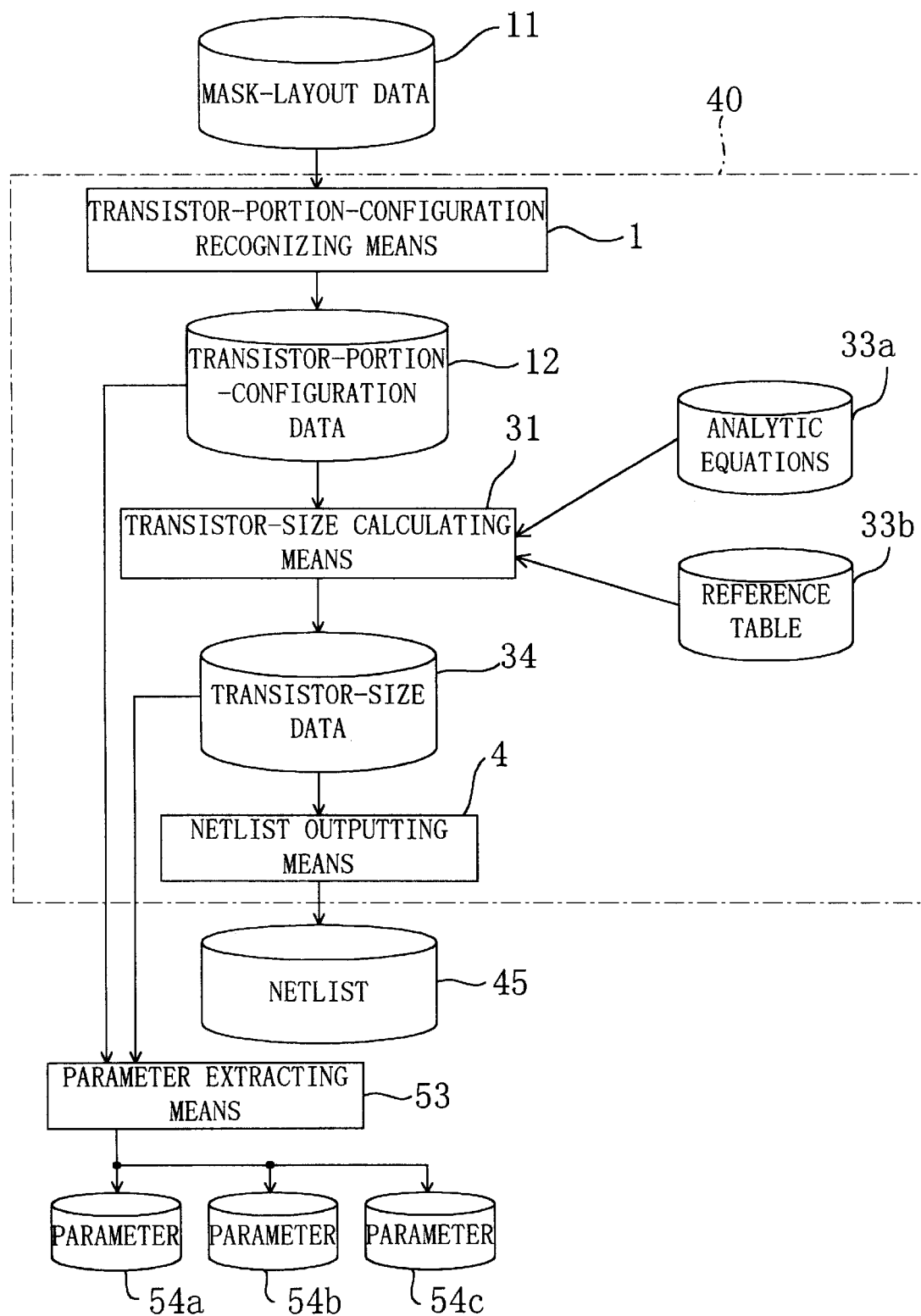
FIG. 13 is a block diagram showing the structure of a circuit extracting apparatus according to a fourth embodiment of the present invention.

FIG. 13 is a block diagram showing the structure of the circuit extracting apparatus 40 in the information generating system for simulation according to the present embodiment. In the drawing, a transistor-portion-configuration recognizing means 1 initially reads mask-layout data 11, recognizes a MOS transistor and the configuration of the transistor portion thereof, and outputs transistor-portion-configuration data 12. A transistor-size calculating means 31 reads the transistor-portion-configuration data 12, obtains an equivalent transistor width and an equivalent transistor length such that the gate capacitance in the circuit simulation coincides with the gate capacitance in the actual device through calculation using the analytic equations 33a or with reference to the reference table 33b and outputs the equivalent transistor width and equivalent transistor length as transistor-size data 34. A netlist outputting means 4 reads the transistor-size data 34 and outputs the netlist 45.

The circuit extracting apparatus 40 shown in FIG. 13 is different from the circuit extracting apparatus 30 according to the third embodiment shown in FIG. 10 in that it does not comprise the corrective-current-source generating means 32. Accordingly, the netlist 45 does not include information on the corrective current source, which is different from the netlist 38 shown in FIG. 10. Since the operations of the transistor-portion-configuration recognizing means 1, the transistor-size calculating means 31, and the netlist-outputting means 4 are the same as in the third embodiment, the description thereof is omitted here.

The circuit extracting apparatus 40 outputs the transistor-portion-configuration data 12 and the transistor-size data 34 to the parameter extracting means 53. The parameter extracting means 53 extracts parameters 54a, 54b, 54c, . . . for respective transistors by using the equivalent transistor size (equivalent transistor width, equivalent transistor length) included in the transistor-size data.

Thus, according to the present embodiment, the gate capacitance can be adjusted to coincide with the actual value by calculating the equivalent transistor size and incorporating the calculated equivalent transistor size into the netlist, while the drain current can be adjusted to coincide with the actual value by correcting the parameter by using the equivalent transistor size. Therefore, it becomes possible to reproduce both of the physical quantities of the drain current and gate capacitance with high fidelity in the circuit simulation.

Similar to the second embodiment, it is possible that, in view of the influence exerted by the difference between the mask layouts and the finished configurations on the operations of the actual devices, the mask layouts are preliminarily converted in consideration of the finished configurations of the actual devices, an equivalent transistor size is calculated for a mask layout obtained through the conversion and the parameter is corrected using the thus calculated transistor size, thereby the circuit simulation is performed with further higher fidelity.

We claim:

1. A circuit extracting apparatus for extracting circuit information for use in circuit simulation by a circuit simulator that determines a drain current and a gate capacitance of a transistor based on only the transistor size from a mask layout of a semiconductor circuit, comprising:

means for obtaining an equivalent transistor size for a transistor contained in said semiconductor circuit based on a configuration and a size of said transistor recognized in said mask layout, such that a drain current of said transistor in the circuit simulation coincides with a drain current of said transistor in an actual device, and means for: determining a virtual gate capacitance of said transistor in the circuit simulation based on said equivalent transistor size: determining another gate capacitance of said transistor in the actual device based on the configuration and size of said transistor recognized in said mask layout; and generating a corrective capacitance corresponding to the difference between said virtual gate capacitance and said another gate capacitance, wherein data on said equivalent transistor size and said corrective capacitance serves as the circuit information for use in the circuit simulation.

2. A circuit extracting apparatus for extracting circuit information for use in circuit simulation by a circuit simulator that determines a drain current and a gate capacitance of a transistor based on only the transistor size from a mask layout of a semiconductor circuit, comprising:

transistor-portion-configuration recognizing means for recognizing a transistor in said mask layout and recognizing a configuration of a transistor portion of the recognized transistor;

transistor-size calculating means for calculating, based on the configuration of the transistor portion recognized by said transistor-portion-configuration recognizing means and a size of the recognized transistor in said mask layout, an equivalent transistor size such that a drain current of said transistor in the circuit simulation coincides with a drain current of said transistor in an actual device; and corrective-capacitance generating means for obtaining the difference between a gate capacitance of said transistor in the circuit simulation using the equivalent transistor size calculated by said transistor-size calculating means and a gate capacitance of said transistor in the actual device obtained based on the configuration and size of said transistor recognized in said mask layout, and virtually generating a corrective capacitance having a capacitance value corresponding to the obtained difference.

3. A circuit extracting apparatus for extracting circuit information for use in circuit simulation by a circuit simulator that determines a drain current and a gate capacitance of a transistor based on only the transistor size from a mask layout reflecting a final configuration of a manufactured semiconductor circuit, comprising:

means for obtaining an equivalent transistor size for a transistor contained in said semiconductor circuit based on a partially curved configuration and size of said transistor recognized in said mask layout, such that a drain current of said transistor in the circuit simulation coincides with a drain current of said transistor in an actual device; and means for: determining a virtual gate capacitance of said transistor in the circuit simulation based on said equivalent transistor size, determining another gate capacitance of said transistor in the actual device based on the configuration and size of said transistor recognized in said mask layout; and generating a corrective capacitance corresponding to the difference between said virtual gate capacitance and said another gate capacitance, wherein data on said equivalent transistor size and said corrective capacitance serves as the circuit information for use in the circuit simulation.

4. A circuit extracting apparatus for extracting circuit information for use in circuit simulation by a circuit simulator that determines a drain current and a gate capacitance of a transistor based on only the transistor size from a mask layout reflecting a final configuration of a manufactured semiconductor circuit, comprising:

transistor-portion-configuration recognizing means for recognizing a transistor in said mask layout and recognizing a partially curved configuration of a transistor port ion of the recognized transistor;

transistor-size calculating means for calculating, based on the configuration of the transistor portion recognized by said transistor-portion-configuration recognizing means and a size of the recognized transistor in said mask layout, an equivalent transistor size such that a drain current of said transistor in the circuit simulation coincides with a drain current of said transistor in an actual device; and corrective-capacitance generating means for obtaining the difference between a gate capacitance of said transistor in the circuit simulation using the equivalent transistor size calculated by said transistor-size calculating means and a gate capacitance of said transistor in the actual device obtained based on the configuration and size of said transistor recognized in said mask layout, and virtually generating a corrective capacitance having a capacitance value corresponding to the obtained difference.

5. A circuit extracting apparatus for extracting circuit information for use in circuit simulation by a circuit simulator that determines a drain current and a gate capacitance of a transistor based on only the transistor size from a mask layout of a semiconductor circuit, comprising:

means for obtaining an equivalent transistor size for a transistor contained in said semiconductor circuit based on a configuration and size of said transistor recognized in said mask layout, such that a gate capacitance of said transistor in the circuit simulation coincides with a gate capacitance of said transistor in an actual device, and means for: determining a virtual drain current of said transistor in the circuit simulation based on said equivalent transistor size; determining another drain current of said transistor in the actual device based on the configuration and size of said transistor recognized in said mask layout: and generating a corrective current source corresponding to the difference between said virtual drain current and said another drain current, wherein data on said equivalent transistor size and said corrective current source serves as the circuit information for use in the circuit simulation.

6. A circuit extracting apparatus for extracting circuit information for use in circuit simulation by a circuit simulator that determines a drain current and a gate capacitance of a transistor based on only the transistor size from a mask layout of a semiconductor circuit, comprising:

transistor-portion-configuration recognizing means for recognizing a transistor in said mask layout and recognizing a configuration of a transistor portion of the recognized transistor;

transistor-size calculating means for calculating, based on the configuration of the transistor portion recognized by said transistor-portion-configuration recognizing means and a size of the recognized transistor in said mask layout, an equivalent transistor size such that a gate capacitance of said transistor in the circuit simulation coincides with a gate capacitance of said transistor in an actual device; and corrective-current -source generating means for obtaining the difference between a drain current of said transistor in the circuit simulation using the equivalent transistor size calculated by said transistor-size calculating means and a drain current of said transistor in the actual device obtained based on the configuration and size of said transistor recognized in said mask layout, and virtually generating a corrective current source having a current value corresponding to the obtained difference.

7. A circuit extracting apparatus for extracting circuit information for use in circuit simulation by a circuit simulator that determines a drain current and a gate capacitance of a transistor based on only the transistor size from a mask layout reflecting a final configuration of a manufactured semiconductor circuit, comprising:

means for obtaining an equivalent transistor size for a transistor contained in said semiconductor circuit based on a partially curved configuration and a size of said transistor recognized in said mask layout, such that a gate capacitance of said transistor in the circuit simulation coincides with a gate capacitance of said transistor in an actual device; and means for: determining a virtual drain current of said transistor in the circuit simulation based on said equivalent transistor size, determining another drain current of said transistor in the actual device based on the configuration and size of said transistor recognized in said mask layout; and generating a corrective current source corresponding to the difference between said virtual drain current and said another drain current, wherein data on said equivalent transistor size and said corrective current source serves as the circuit information for use in the circuit simulation.

8. A circuit extracting apparatus for extracting circuit information for use in circuit simulation by a circuit simulator that determines a drain current and a gate capacitance of a transistor based on only the transistor size from a mask layout reflecting a final configuration of a manufactured semiconductor circuit, comprising:

transistor-portion-configuration recognizing means for recognizing a transistor in said mask layout and recognizing a partially curved configuration of a transistor portion of the recognized transistor;

transistor-size calculating means for calculating, based on the configuration of the transistor portion recognized by said transistor-portion-configuration recognizing means and a size of the recognized transistor in said mask layout, an equivalent transistor size such that a gate capacitance of said transistor in the circuit simulation coincides with a gate capacitance of said transistor in an actual device; and corrective-current-source generating means for obtaining the difference between a drain current of said transistor in the circuit simulation using the equivalent transistor size calculated by said transistor-size calculating means and a drain current of said transistor in the actual device obtained based on the configuration and size of said transistor recognized in said mask layout, and virtually generating a corrective current source having a current value corresponding to the obtained difference.

9. An information generating system for simulation, comprising:

a circuit extracting apparatus for extracting circuit information for use in circuit simulation by a circuit simulator that determines a drain current and a gate capacitance of a transistor based on only the transistor size from a mask layout of a semiconductor circuit; and parameter extracting means for extracting a parameter for use in the circuit simulation from information including information on a manufacturing process of said semiconductor circuit, wherein said circuit extracting apparatus obtains an equivalent transistor size for a transistor contained in said semiconductor circuit based on a configuration and a size of said transistor recognized in said mask layout, such that a gate capacitance of said transistor in the circuit simulation coincides with a gate capacitance of said transistor in an actual device, and outputs the obtained equivalent transistor size as the circuit information for use in the circuit simulation, and said parameter extracting means receives the equivalent transistor size obtained by said circuit extracting apparatus and extracts the parameter such that a drain current of said transistor in the circuit simulation using the equivalent transistor size coincides with a drain current of said transistor in the actual device.

10. An information generating system for simulation, comprising:

a circuit extracting apparatus for extracting circuit information for use in circuit simulation by a circuit simulator that determines a drain current and a gate capacitance of a transistor based on only the transistor size from a mask layout reflecting a final configuration of a manufactured semiconductor circuit; and parameter extracting means for extracting a parameter for use in the circuit simulation from information including information on a manufacturing process of said semiconductor circuit, wherein said circuit extracting apparatus obtains an equivalent transistor size for a transistor contained in said semiconductor circuit based on a partially curved configuration and a size of said transistor recognized in said mask layout, such that a gate capacitance of said transistor in the circuit simulation coincides with a gate capacitance of said transistor in an actual device, and outputs the obtained equivalent transistor size as the circuit information for use in the circuit simulation, and said parameter extracting means receives the equivalent transistor size obtained by said circuit extracting apparatus and extracts the parameter such that a drain current of said transistor in the circuit simulation using the equivalent transistor size coincides with a drain current of said transistor in the actual device.

11. A circuit extracting method of extracting circuit information for use in circuit simulation by a circuit simulator that determines a drain current and a gate capacitance of a transistor based on only the transistor size from a mask layout of a semiconductor circuit, comprising the steps of:

obtaining an equivalent transistor size for a transistor contained in said semiconductor circuit based on a configuration and a size of said transistor recognized in said mask layout, such that a drain current of said transistor in the circuit simulation coincides with a drain current of said transistor in an actual device determining a virtual gate capacitance of said transistor in the circuit simulation based on said equivalent transistor size;

determining another gate capacitance of said transistor in the actual device based on the configuration and size of said transistor recognized in said mask layout; and generating a corrective capacitance corresponding to the difference between said virtual gate capacitance and said another gate capacitance, wherein data on said equivalent transistor size and said corrective capacitance serves as the circuit information for use in the circuit simulation.

12. A circuit extracting method of extracting circuit information for use in circuit simulation by a circuit simulator that determines a drain current and a gate capacitance of a transistor based on only the transistor size from a mask layout of a semiconductor circuit, comprising:

a transistor-portion-configuration recognizing step of recognizing a transistor in said mask layout and recognizing a configuration of a transistor portion of the recognized transistor;

a transistor-size calculating step of calculating, based on the configuration of the transistor portion recognized in said transistor-portion-configuration recognizing step and a size of the recognized transistor in said mask layout, an equivalent transistor size such that a drain current of said transistor in the circuit simulation coincides with a drain current of said transistor in an actual device; and a corrective-capacitance generating step of obtaining the difference between a gate capacitance of said transistor in the circuit simulation using the equivalent transistor size calculated in said transistor-size calculating step and a gate capacitance of said transistor in the actual device obtained based on the configuration and size of said transistor recognized in said mask layout, and virtually generating a corrective capacitance having a capacitance value corresponding to the obtained difference.

13. A circuit extracting method of extracting circuit information for use in circuit simulation by a circuit simulator that determines a drain current and a gate capacitance of a transistor based on only the transistor size from a mask layout reflecting a final configuration of a manufactured semiconductor circuit, comprising the steps of:

obtaining an equivalent transistor size for a transistor contained in said semiconductor circuit based on a partially curved configuration and a size of said transistor recognized in said mask layout, such that a drain current of said transistor in the circuit simulation coincides with a drain current of said transistor in an actual device;

determining a virtual Sate capacitance of said transistor in the circuit simulation based on said equivalent transistor size;

determining another gate capacitance of said transistor in the actual device based on the configuration and size of said transistor recognized in said mask layout; and generating a corrective capacitance corresponding to the difference between said virtual gate capacitance and said another gate capacitance, wherein data on said equivalent transistor size and said corrective capacitance serves as the circuit information for use in the circuit simulation.

14. A circuit extracting method of extracting circuit information for use in circuit simulation by a circuit simulator that determines a drain current and a gate capacitance of a transistor based on only the transistor size from a mask layout reflecting a final configuration of a manufactured semiconductor circuit, comprising:

a transistor-portion-configuration recognizing step of recognizing a transistor in said mask layout and recognizing a partially curved configuration of a transistor portion of the recognized transistor;

a transistor-size calculating step of calculating, based on the configuration of the transistor portion recognized in said transistor-portion-configuration recognizing step and a size of the recognized transistor in said mask layout, an equivalent transistor size such that a drain current of said transistor in the circuit simulation coincides with a drain current of said transistor in an actual device; and a corrective-capacitance generating step of obtaining the difference between a gate capacitance of said transistor in the circuit simulation using the equivalent transistor size calculated in said transistor-size calculating step and a gate capacitance of said transistor in the actual device obtained based on the configuration and size of said transistor recognized in said mask layout, and virtually generating a corrective capacitance having a capacitance value corresponding to the obtained difference.

15. A circuit extracting method of extracting circuit information for use in circuit simulation by a circuit simulator that determines a drain current and a gate capacitance of a transistor based on only the transistor size from a mask layout of a semiconductor circuit, comprising the steps of:

obtaining an equivalent transistor size for a transistor contained in said semiconductor circuit based on a configuration and a size of said transistor recognized in said mask layout, such that a gate capacitance of said transistor in the circuit simulation coincides with a gate capacitance of said transistor in an actual device;

determining a virtual drain current of said transistor in the circuit simulation based on said equivalent transistor size;

determining another drain current of said transistor in the actual device based on the configuration and size of said transistor recognized in said mask layout; and generating a corrective current corresponding to the difference between said virtual drain current and said another drain current, wherein data on said equivalent transistor size and said corrective current source serves as the circuit information for use in the circuit simulation.

16. A circuit extracting method of extracting circuit information for use in circuit simulation by a circuit simulator that determines a drain current and a gate capacitance of a transistor based on only the transistor size from a mask layout of a semiconductor circuit, comprising:

a transistor-portion-configuration recognizing step of recognizing a transistor in said mask layout and recognizing a configuration of a transistor portion of the recognized transistor;

a transistor-size calculating step of calculating, based on the configuration of the transistor portion recognized in said transistor-portion-configuration recognizing step and a size of the recognized transistor in said mask layout, an equivalent transistor size such that a gate capacitance of said transistor in the circuit simulation coincides with a gate capacitance of said transistor in an actual device; and a corrective-current-source generating step of obtaining the difference between a drain current of said transistor in the circuit simulation using the equivalent transistor size calculated in said transistor-size calculating step and a drain current of said transistor in the actual device obtained based on the configuration and size of said transistor recognized in said mask layout, and virtually generating a corrective current source having a current value corresponding to the obtained difference.

17. A circuit extracting method of extracting circuit information for use in circuit simulation by a circuit simulator that determines a drain current and a gate capacitance of a transistor based on only the transistor size from a mask layout reflecting a final configuration of a manufactured semiconductor circuit, comprising the steps of:

obtaining an equivalent transistor size for a transistor contained in said semiconductor circuit based on a partially curved configuration and a size of said transistor recognized in said mask layout, such that a gate capacitance of said transistor in the circuit simulation coincides with a gate capacitance of said transistor in an actual device;

determining a virtual drain current of said transistor in the circuit simulation based on said equivalent transistor size;

determining another drain current of said transistor in the actual device based on the configuration and size of said transistor recognized in said mask layout; and generating a corrective current corresponding to the difference between said virtual drain current and said another drain current, wherein data on said equivalent transistor size and said corrective current source serves as the circuit information for use in the circuit simulation.

18. A circuit extracting method of extracting circuit information for use in circuit simulation by a circuit simulator that determines a drain current and a gate capacitance of a transistor based on only the transistor size from a mask layout reflecting a final configuration of a manufactured semiconductor circuit, comprising:

a transistor-portion-configuration recognizing step of recognizing a transistor in said mask layout and recognizing a partially curved configuration of a transistor portion of the recognized transistor;

a transistor-size calculating step of calculating, based on the configuration of the transistor portion recognized in said transistor-portion-configuration recognizing step and a size of the recognized transistor in said mask layout, an equivalent transistor size such that a gate capacitance of said transistor in the circuit simulation coincides with a gate capacitance of said transistor in an actual device; and a corrective-current-source generating step of obtaining the difference between a drain current of said transistor in the circuit simulation using the equivalent transistor size calculated in said transistor-size calculating step and a drain current of said transistor in the actual device obtained based on the configuration and size of said transistor recognized in said mask layout, and virtually generating a corrective current source having a current value corresponding to the obtained difference.

19. An information generating method for simulation, comprising:

a circuit extracting step of extracting circuit information for use in circuit simulation by a circuit simulator that determines a drain current and a gate capacitance of a transistor based on only the transistor size from a mask layout of a semiconductor circuit; and a parameter extracting step of extracting a parameter for use in the circuit simulation from information including information on a manufacturing process of said semiconductor circuit, wherein said circuit extracting step comprises the step of obtaining an equivalent transistor size for a transistor contained in said semiconductor circuit based on a configuration and a size of said transistor recognized in said mask layout, such that a gate capacitance of said transistor in the circuit simulation coincides with a gate capacitance of said transistor in an actual device, and said parameter extracting step comprises the step of extracting the parameter such that a drain current of said transistor in the circuit simulation using the equivalent transistor size coincides with a drain current of said transistor in the actual device.

20. An information generating method for simulation, comprising:

a circuit extracting step of extracting circuit information for use in circuit simulation by a circuit simulator that determines a drain current and a gate capacitance of a transistor based on only the transistor size from a mask layout reflecting a final configuration of a manufactured semiconductor circuit; and a parameter extracting step of extracting a parameter for use in the circuit simulation from information including information on a manufacturing process of said semiconductor circuit, wherein said circuit extracting step comprises the step of obtaining an equivalent transistor size for a transistor contained in said semiconductor circuit based on a partially curved configuration and a size of said transistor recognized in said mask layout, such that a gate capacitance of said transistor in the circuit simulation coincides with a gate capacitance of said transistor in an actual device, and said parameter extracting step comprises the step of extracting the parameter such that a drain current of said transistor in the circuit simulation using the equivalent transistor size coincides with a drain current of said transistor in the actual device.

21. A method of using a netlist for describing a circuit structure of a semiconductor circuit comprising the steps of:

replacing a transistor size of a transistor contained in the semiconductor circuit by an equivalent transistor size based on a configuration and a size of the transistor such that a drain current of said transistor in a circuit simulation using said netlist by a circuit simulator that determines a drain current and a gate capacitance of a transistor based on only the transistor size coincides with a drain current of said transistor in an actual device, and virtually generating a corrective capacitance having a capacitance value corresponding to the difference between a gate capacitance of said transistor in the circuit simulation using said equivalent transistor size and a gate capacitance of said transistor in the actual device.

22. A method of using a netlist for describing a circuit structure of a semiconductor circuit comprising the steps of:

replacing a transistor size of a transistor contained in the semiconductor circuit by an equivalent transistor size based on a configuration and a size of the transistor such that a gate capacitance of said transistor in a circuit simulation using said netlist by a circuit simulator that determines a drain current and a gate capacitance of a transistor based on only the transistor size coincides with a gate capacitance of said transistor in an actual device and virtually generating a corrective current source having a current value corresponding to the difference between a drain current of said transistor in the circuit simulation using said equivalent transistor size and a drain current of said transistor in the actual device.

23. A netlist for describing a circuit structure of a semiconductor circuit, the net list comprising:

an equivalent transistor which replaces a transistor contained in the semiconductor circuit with an equivalent transistor size based on a configuration and a size of the transistor such that a drain current of said equivalent transistor in a circuit simulation using said netlist by a circuit simulator that determines a drain current and a gate capacitance of a transistor based on only the transistor size coincides with a drain current of said transistor in said semiconductor circuit; and a corrective capacitance which is virtually generated and has a capacitance value corresponding to the difference between a gate capacitance of said equivalent transistor in the circuit simulation and a gate capacitance of said transistor in said semiconductor circuit.

24. A netlist for describing a circuit structure of a semiconductor circuit, the net list comprising:

an equivalent transistor which replaces a transistor contained in the semiconductor circuit by an equivalent transistor size based on a configuration and a size of the transistor such that a gate capacitance of said equivalent transistor in a circuit simulation using said netlist by a circuit simulator that determines a drain current and a gate capacitance of a transistor based on only the transistor size coincides with a gate capacitance of said transistor in said semiconductor circuit; and a corrective current source which is virtually generated and has a current value corresponding to the difference between a drain current of said equivalent transistor in the circuit simulation and a drain current of said transistor in said semiconductor circuit.

* * * * *